(12) United States Patent
Li et al.

(10) Patent No.: US 12,433,563 B2
(45) Date of Patent: Oct. 7, 2025

(54) VOLTAGE CALIBRATION DEVICES, METHODS AND IMAGING SYSTEMS INCLUDING THEREOF

(71) Applicant: SHANGHAI UNITED IMAGING MICROELECTRONICS TECHNOLOGY CO., LTD., Shanghai (CN)

(72) Inventors: Chengzhi Li, Shanghai (CN); Qingzhong Zhao, Shanghai (CN); Jianguo Diao, Shanghai (CN); Zhigang Li, Shanghai (CN); Yue Liu, Shanghai (CN); Longzi Yang, Shanghai (CN)

(73) Assignee: SHANGHAI UNITED IMAGING MICROELECTRONICS TECHNOLOGY CO., LTD., Shanghai (CN)

( * ) Notice: Subject to any disclaimer, the term of this patent is extended or adjusted under 35 U.S.C. 154(b) by 373 days.

(21) Appl. No.: 18/171,298

(22) Filed: Feb. 17, 2023

(65) Prior Publication Data
US 2023/0266780 A1    Aug. 24, 2023

(30) Foreign Application Priority Data
Feb. 18, 2022 (CN) .......................... 202210150370.8

(51) Int. Cl.
*A61B 6/58* (2024.01)
(52) U.S. Cl.
CPC .................................. *A61B 6/582* (2013.01)

(58) Field of Classification Search
CPC ...................................................... A61B 6/582
See application file for complete search history.

(56) References Cited

U.S. PATENT DOCUMENTS

| | | | | |
|---|---|---|---|---|
| 4,134,018 A | * | 1/1979 | Weinkauf | G01T 1/185 |
| | | | | 250/385.1 |
| 5,929,692 A | * | 7/1999 | Carsten | H02M 1/15 |
| | | | | 327/551 |
| 6,424,630 B1 | * | 7/2002 | Ang | H04L 25/06 |
| | | | | 370/251 |

(Continued)

FOREIGN PATENT DOCUMENTS

| | | |
|---|---|---|
| CN | 101882929 A | 11/2010 |
| CN | 101888246 A | 11/2010 |

(Continued)

*Primary Examiner* — Blake C Riddick
(74) *Attorney, Agent, or Firm* — METIS IP LLC

(57) ABSTRACT

The present disclosure provides a voltage calibration device, method and imaging system. The voltage calibration device, comprising: a channel selector and a calibration unit, wherein an input end of the channel selector is selectively connected to channels to be calibrated of multiple detectors to receive a common mode voltage of each channel to be calibrated; a first input end of the calibration unit is connected to an output end of the channel selector, an output end of the calibration unit is connected to the multiple channels to be calibrated, the calibration unit adjusting the common mode voltage of each channel to be calibrated to a calibrated common mode voltage to cause each channel to be calibrated to be detected under its corresponding calibrated common mode voltage.

16 Claims, 8 Drawing Sheets

(56) References Cited

U.S. PATENT DOCUMENTS

| | | | |
|---|---|---|---|
| 8,982,029 B2* | 3/2015 | Wu | G09G 3/3655 345/98 |
| 9,467,638 B2 | 10/2016 | Chen et al. | |
| 10,742,226 B1 | 8/2020 | Chen et al. | |
| 10,861,377 B2 | 12/2020 | Huang | |
| 2004/0135564 A1* | 7/2004 | Huang | H02M 3/1588 323/282 |
| 2005/0154547 A1* | 7/2005 | Nguyen | G06F 1/26 702/85 |
| 2006/0055383 A1* | 3/2006 | Eberlein | G05F 1/575 323/280 |
| 2007/0294558 A1* | 12/2007 | Desai | G06F 1/3203 713/340 |
| 2008/0024100 A1* | 1/2008 | Huang | H02M 3/158 323/282 |
| 2008/0116902 A1* | 5/2008 | Kim | H04B 1/30 375/319 |
| 2009/0058524 A1* | 3/2009 | Park | H04B 17/318 330/254 |
| 2009/0058698 A1* | 3/2009 | Chen | H03M 1/1019 341/120 |
| 2010/0202227 A1* | 8/2010 | Nguyen | G11C 5/063 365/198 |
| 2011/0181361 A1* | 7/2011 | Nolan | H03F 3/45197 330/278 |
| 2012/0074916 A1* | 3/2012 | Trochut | H02M 3/1582 323/271 |
| 2012/0133345 A1* | 5/2012 | Tai | G05F 1/40 323/282 |
| 2012/0194265 A1 | 8/2012 | Katsube et al. | |
| 2013/0327932 A1* | 12/2013 | Kim | A61B 6/03 250/252.1 |
| 2014/0002042 A1* | 1/2014 | Wismar | H02M 3/157 323/282 |
| 2014/0022102 A1* | 1/2014 | Cho | H03M 3/38 341/120 |
| 2015/0035507 A1* | 2/2015 | Cowley | H02M 3/156 323/265 |
| 2015/0042295 A1* | 2/2015 | Cowley | H02M 3/158 323/269 |
| 2016/0099722 A1* | 4/2016 | Lin | H03M 1/466 341/118 |
| 2017/0114628 A1* | 4/2017 | Khalaj Amineh | E21B 47/007 |
| 2017/0201263 A1* | 7/2017 | Lee | H03M 1/0604 |
| 2018/0064410 A1* | 3/2018 | Li | A61B 6/582 |
| 2018/0299565 A1* | 10/2018 | Cresens | G01T 1/1645 |
| 2020/0321972 A1* | 10/2020 | Gharibdoust | H03M 1/1245 |
| 2021/0167788 A1* | 6/2021 | Su | G06F 7/588 |
| 2021/0335316 A1* | 10/2021 | Yang | G09G 3/3655 |

FOREIGN PATENT DOCUMENTS

| | | |
|---|---|---|
| CN | 208299759 U | 12/2018 |
| CN | 109658472 | 4/2019 |
| CN | 109660219 A | 4/2019 |
| CN | 112394314 A | 2/2021 |
| CN | 110389746 B | 4/2021 |
| CN | 213365348 U | 6/2021 |
| CN | 108631783 B | 7/2021 |
| FR | 3032063 A1 | 7/2016 |

* cited by examiner

7000

Obtaining common mode voltages of multiple channels to be calibrated 710

Adjusting the common mode voltages of the multiple channels to be calibrated to calibrated common mode voltages such that the multiple channels to be calibrated are detected under the calibrated common mode voltages 720

FIG. 7

VOLTAGE CALIBRATION DEVICES, METHODS AND IMAGING SYSTEMS INCLUDING THEREOF

CROSS-REFERENCE TO RELATED APPLICATIONS

This application claims priority of Chinese Patent Application No. 202210150370.8, filed on Feb. 18, 2022, the entire contents of which are incorporated herein by reference.

TECHNICAL FIELD

The present disclosure relates to the field of image acquisition, and in particular to a voltage calibration device and method in an imaging system.

BACKGROUND

Multiple channels can often be utilized in the imaging system to read what is acquired by the detector (e.g., a signal, a voltage, etc.). For example, a Positron Emission Computed Tomography (PET) imaging system supplies power to multiple channels of an Application Specific Integrated Circuit (ASIC) and to a silicon photomultiplier (SiPM) of a detector crystal connected to each channel, thereby reading a light signal detected by the SiPM of the detector through multiple channels.

However, the production process of the apparatus can lead to structural differences between multiple channels, making the channels susceptible to differences in common mode voltage, which can affect the performance of the detector crystal connected to the channel, resulting in degradation of the quality of the imaging system.

Therefore, there is a need to propose a voltage calibration device that can improve channel consistency.

SUMMARY

One embodiment of the present disclosure provides a voltage calibration device, comprising: a channel selector and a calibration unit, wherein an input ends of the channel selector is selectively connected to channels to be calibrated of multiple detectors to receive a common mode voltage of each channel to be calibrated; a first input end of the calibration unit is connected to an output end of the channel selector, an output end of the calibration unit is connected to the multiple channels to be calibrated, the calibration unit adjusting the common mode voltage of each channel to be calibrated to a calibrated common mode voltage to cause each channel to be calibrated to be detected under its corresponding calibrated common mode voltage, wherein the calibrated common mode voltages of the multiple channels to be calibrated are within a preset voltage range.

In embodiments of the present disclosure, the voltage calibration device can adjust the common mode voltages of the multiple channels to be calibrated to a same preset voltage range through the calibration unit, making the calibrated common mode voltages close, thus increasing the consistency of the channels, ensuring the performance of the detectors connected to the channels and improving the quality of the imaging system.

In some embodiments, a second input end of the calibration unit receives a target channel voltage, and the calibration unit adjusts the common mode voltage of each channel to be calibrated to the calibrated common mode voltage based on a comparison result of the target channel voltage and the common mode voltage; wherein a difference between calibrated common mode voltages of the multiple channels to be calibrated and the target channel voltage is less than a preset voltage threshold.

In some embodiments, the calibration unit adjusts the common mode voltage of each channel to be calibrated to the calibrated common mode voltage based on a comparison result of the target channel voltage and the common mode voltage, the calibration unit is configured to: adjust, by the calibration unit, the common mode voltage to vary a preset stepping voltage based on the comparison result of the target channel voltage and the common mode voltage.

In some embodiments, the calibration unit is configured to: adjust the common mode voltage incrementally to increase by the preset stepping voltage when the common mode voltage is less than the target channel voltage; and adjust the common mode voltage incrementally to decrease by the preset stepping voltage when the common mode voltage is greater than the target channel voltage.

In some embodiments, the calibration unit is further configured to: adjust the common mode voltage to vary the preset stepping voltage according to each comparison result of the target channel voltage and the common mode voltage until the calibrated common mode voltage is output after the comparison result is changed.

In some embodiments, the preset stepping voltage includes a first stepping voltage and a second stepping voltage, wherein the first stepping voltage and the second stepping voltage are different; and the calibration unit is further configured to: select the first stepping voltage or the second stepping voltage to adjust the common mode voltage according to a comparison result of a difference of the target channel voltage and the common mode voltage with a preset voltage difference range.

In some embodiments, the calibration unit includes a comparator and a result checker; a first input end of the comparator receives the common mode voltage of each channel to be calibrated, a second input end of the comparator receives the target channel voltage, and an output end of the comparator outputs a calibration signal to adjust the common mode voltage to vary the preset stepping voltage, the calibration signal being determined according to the comparison result of the common mode voltage with the target channel voltage; and an input end of the result checker is connected to the output end of the comparator, the result checker is configured to send to an end calibration signal to the channel selector corresponding to each channel to be calibrated.

In some embodiments, the result checker is configured to: send the end-of-calibration signal, if the common mode voltage is greater than or equal to the target channel voltage in a current comparison, and a last comparison result is that the common mode voltage is less than the target channel voltage, then the end-of-calibration signal is sent; or if the common mode voltage is less than or equal to the target channel voltage in the current comparison, and the last comparison result is that the common mode voltage is greater than the target channel voltage.

In some embodiments, the preset stepping voltage is related to the preset voltage threshold.

In some embodiments, the calibration unit further includes at least one voltage controller, wherein an input end of the at least one voltage controller is connected to the output end of the comparator, and an output end of the at least one voltage controller is connected to a corresponding channel to be calibrated, wherein the at least one voltage controller adjusts the common mode voltage according to the comparison result so that the first input end of the comparator receives the adjusted common mode voltage.

In some embodiments, the at least one voltage controller includes a digital-to-analog converter and a feedback amplifier circuit; an input end of the digital-to-analog converter is connected at least to the output end of the comparator, the input end of the digital-to-analog converter receives the calibration signal and adjusts a output analog signal according to the calibration signal; an input end of the feedback amplifier circuit is connected at least to the output end of the digital-to-analog converter, an output end of the feedback amplifier circuit is connected to the corresponding channel to be calibrated, the feedback amplifier circuit adjusting the common mode voltage of the corresponding channel to be calibrated according to the analog signal.

In some embodiments, the digital-to-analog converter outputs an analog voltage signal, the feedback amplifier circuit includes a main amplifier and a first auxiliary amplifier; wherein a positive input end of the main amplifier is connected to the output end of the digital-to-analog converter, a negative input end of the main amplifier is connected to an output end of the first auxiliary amplifier, an output end of the main amplifier is connected to an input end of the first auxiliary amplifier, and the output end of the first auxiliary amplifier is further connected to the corresponding channel to be calibrated to adjust a common mode voltage of the channel to be calibrated according to the analog voltage signal.

In some embodiments, the digital-to-analog converter outputs an analog current signal, the feedback amplifier circuit includes a summator, a transconductance amplifier and a second auxiliary amplifier; wherein a first input end of the summator is connected to the output end of the digital-to-analog converter, a second input end of the summator is connected to an output end of the transconductance amplifier, and an output end of the summator is connected to an input end of the second auxiliary amplifier, the summator being configured to sum a current of the channel to be calibrated and the analog current signal; a negative input end of the transconductance amplifier is connected to an output end of the second auxiliary amplifier, the output end of the second auxiliary amplifier being further connected to the corresponding channel to be calibrated to adjust a common mode voltage of the channel to be calibrated according to the analog current signal.

In some embodiments, the voltage calibration device further includes a capacitor calibration circuit connected to the comparator, the capacitor calibration circuit providing a capacitance correction for the comparator.

In some embodiments, the channel selector is further configured to store the calibrated common mode voltage corresponding to each channel to be calibrated.

One embodiment of the present disclosure provides an imaging system, the imaging system comprising: a processing unit, multiple detectors, multiple channels to be calibrated and a voltage calibration device, wherein the processing unit is connected to the multiple detectors through the multiple channels to be calibrated, the voltage calibration device is selectively connected to the multiple channels to be calibrated, and the voltage calibration device is configured to adjust common mode voltages of the multiple channels to be calibrated.

One embodiment of the present disclosure provides a voltage calibration method, the method is implemented on a voltage calibration device, comprising: obtaining a common mode voltage of multiple channels to be calibrated; calibrating the common mode voltages of the channels to be calibrated common mode voltages such that the channels to be calibrated are detected under the calibrated common mode voltages; wherein the calibrated common mode voltages of the multiple channels to be calibrated are within a preset voltage range.

In some embodiments, the obtaining common mode voltages of multiple channels to be calibrated includes: obtaining, in parallel, a common mode voltage corresponding to each of the channels to be calibrated.

In some embodiments, the obtaining common mode voltages of multiple channels to be calibrated, includes: obtaining the common mode voltages of the multiple channels to be calibrated at different moments, respectively.

In some embodiments, the adjusting the common mode voltages of the multiple channels to be calibrated to calibrated common mode voltages includes: receiving a target channel voltage; adjusting a common mode voltage corresponding to each channel to be calibrated to a calibrated common mode voltage based on a comparison result of the target channel voltage and the common mode voltage of each channel to be calibrated; wherein the differences between the calibrated common mode voltages of the multiple channels to be calibrated and the target channel voltage are less than a preset voltage threshold.

One embodiment of the present disclosure provides a voltage calibration device comprising a processor, the processor being configured to perform the voltage calibration method described above.

One embodiment of the present disclosure a computer-readable storage medium, comprising a set of instructions, wherein when executed by a processor, a voltage calibration method described above is implemented.

BRIEF DESCRIPTION OF THE DRAWINGS

The present disclosure will be further illustrated by way of exemplary embodiments, which will be described in detail by way of the accompanying drawings. These embodiments are not limiting, and in these embodiments the same numbering indicates the same structure wherein:

FIG. 7 is a flowchart illustrating a voltage calibration method according to some embodiments of the present disclosure;

DETAILED DESCRIPTION

Figure 1:
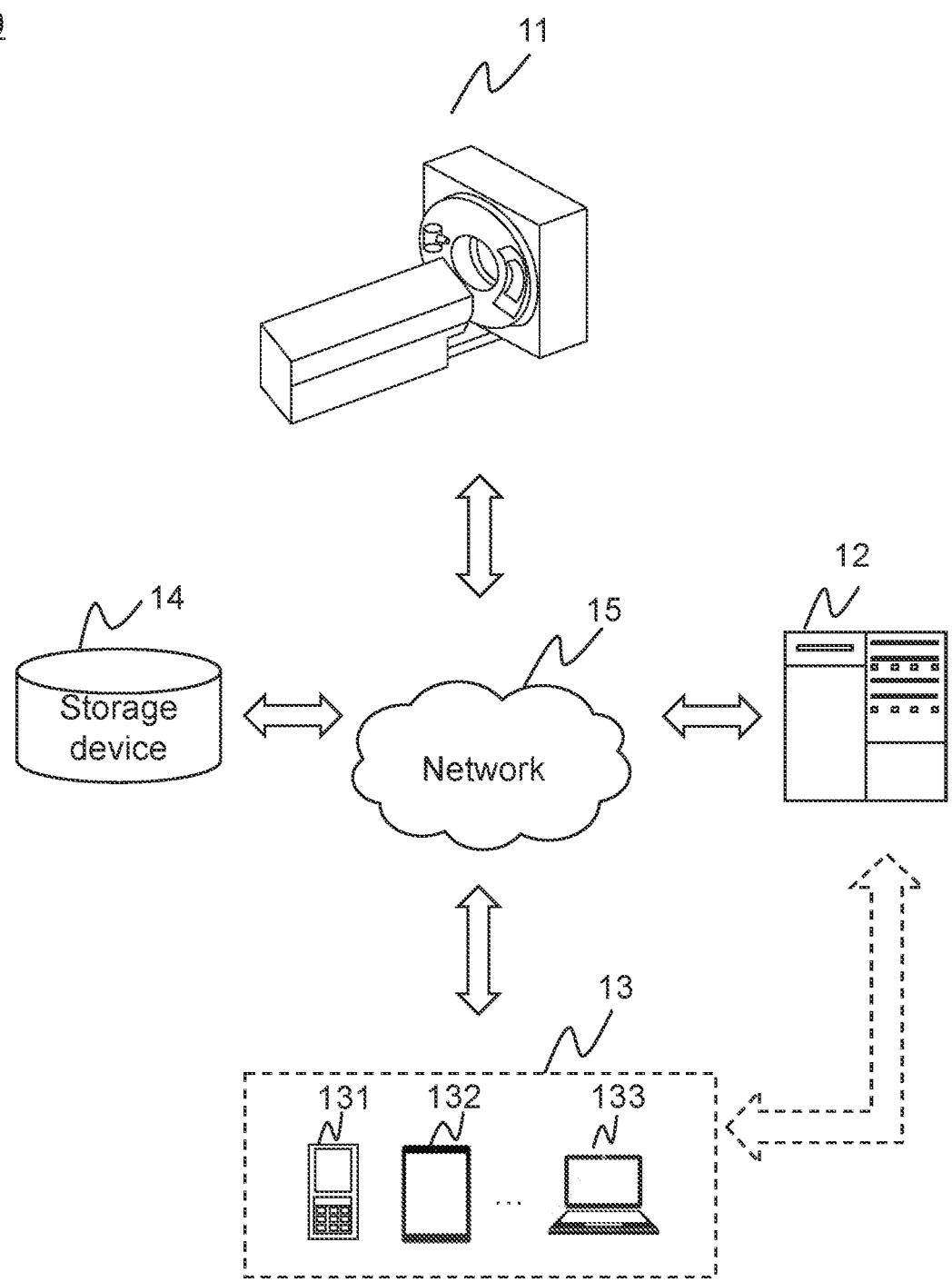
FIG. 1 is a schematic diagram illustrating an application scenario of voltage calibration according to some embodiments of the present disclosure.

The technical schemes of the present disclosure embodiments will be more clearly described below, and the accompanying drawings need to be configured in the description of the embodiments will be briefly described below. Obviously, the drawings in the following description are merely some examples or embodiments of the present disclosure, and will be applied to other similar scenarios according to these accompanying drawings without paying creative labor. Unless obviously obtained from the context or the context illustrates otherwise, the same numeral in the drawings refers to the same structure or operation.

It should be understood that the "system", "device", "unit" and/or "module" used herein is a method for distinguishing different components, elements, components, parts or assemblies of different levels. However, if other words may achieve the same purpose, the words may be replaced by other expressions.

As shown in the present disclosure and claims, unless the context clearly prompts the exception, "a", "one", and/or "the" is not specifically singular, and the plural may be included. It will be further understood that the terms "comprise," "comprises," and/or "comprising," "include," "includes," and/or "including," when used in present disclosure, specify the presence of stated features, integers, steps, operations, elements, and/or components, but do not preclude the presence or addition of one or more other features, integers, steps, operations, elements, components, and/or groups thereof.

The flowcharts are used in present disclosure to illustrate the operations performed by the system according to the embodiment of the present disclosure. It should be understood that the preceding or following operations is not necessarily performed in order to accurately. Instead, the operations may be processed in reverse order or simultaneously. Moreover, one or more other operations may be added to the flowcharts. One or more operations may be removed from the flowcharts.

The voltage calibration device of one or more embodiments of the present disclosure may provide multiple calibrated common mode voltages for applications in a variety of scenarios where the common mode voltages occur, such as where the variability of the common mode voltages of multiple channels connected to a detector during a signal acquisition can be reduced, or where the variability of the common mode voltages of the multiple channels connected to an antenna during a data transmission can be reduced. In some embodiments, the voltage calibration device can be applied not only to an imaging system, but also to other systems that require calibration voltages (e.g., a communication system, a detection system, and other arbitrary multi-channel analog circuit systems). In some embodiments, when only one voltage calibration device is provided, the voltage calibration device may provide a calibrated common mode voltage corresponding to each channel for multiple channels to be calibrated. In some embodiments, when multiple voltage calibration devices are provided, each voltage calibration device may individually provide a calibrated common mode voltage for the corresponding channel(s) to be calibrated. The number of the voltage calibration devices may be selected based on a type of a calibration method.

In some embodiments, the imaging system may include a processing unit, multiple channels, and multiple detectors. The processing unit is connected to the multiple channels, and each channel may be connected to a corresponding detector. In this way, the imaging system may power the multiple channels and the multiple detectors, and obtain a detection signal of the corresponding detector through the multiple channels. However, the production process may lead to structural differences between the multiple channels, making the common mode voltages of the channels have differences, thus affecting the detection performance of detector crystals connected to the channels and reducing the quality of the imaging system.

Embodiments of the present disclosure provide a voltage calibration device comprising a channel selector and a calibration unit. An input end of the channel selector is selectively connected to multiple channels to be calibrated, an input end of the calibration unit is connected to an output end of the channel selector, and an output end of the calibration unit is selectively connected to the multiple channels to be calibrated. The channel selector selects a channel to be calibrated in turn, for calibrating the common mode voltage of each channel to be a calibrated common mode voltage by the calibration unit so that all channels to be calibrated can be detected based on relatively consistent calibrated common mode voltages. Specifically, the voltage calibration device may adjust the common mode voltages of the multiple channels to be within a same preset voltage range, thereby increasing the consistency of the channels, ensuring the detection performance of the detectors connected to the channels and improving the imaging quality of the imaging system.

FIG. 1 is a schematic diagram illustrating an application scenario of voltage calibration according to some embodiments of the present disclosure. As shown in FIG. 1, in some embodiments, the imaging system 10 may include a medical imaging device 11, a processing device 12, a terminal 13, a storage 14, and a network 15.

The medical imaging device 11 is a device that medically reproduces an internal structure of a target object as an image by using a different medium. In some embodiments, the target object may be a living being such as a patient, an animal, etc., or an artificial object such as a body mold, etc. The target object may be a specific part of the patient, e.g., an organ and/or tissue. In some embodiments, the medical imaging device 11 may be any medical device including a detector to image or treat a specified body part of a patient by radionuclides, e.g., SPECT, PET, PET-CT, MRI (magnetic resonance imaging)-PET, SPECT-CT, etc. The medical imaging devices 11 provided above are provided for illustrative purposes only. The detector in the medical imaging device 11 may receive radiation from a radiation source and measure the received radiation. In some embodiments, the medical imaging device 11 may include multiple detectors as shown in some embodiments of the present disclosure, and the multiple detectors may be connected to the processing unit via multiple channels to be calibrated. In some embodiments, the medical imaging device 11 may obtain medical image data by scanning and send it to the processing unit 12. The medical imaging device 11 may receive an instruction, etc., sent by a physician via the terminal 13 and perform relevant operations, e.g., an irradiation imaging, etc., according to the instruction. In some embodiments, the medical imaging device 11 may exchange data and/or information with other components in the system 10 (e.g., the processing device 12, the storage 14, the terminal 13) via the network 15. In some embodiments, the medical imaging device 11 may be directly connected to other components in the system 10.

The processing device 12 may process data and/or information obtained from other devices or system components. In some embodiments, the processing device 12 may process the medical image data obtained from the medical imaging device 11. In some embodiments, the processing device 12 may include a processing unit as shown in some embodiments of the present disclosure, and the processing unit may obtain a signal, data, etc. from the multiple detectors via a readout channel. In some embodiments, the processing device 12 may obtain the stored data and/or information from the storage 14. In some embodiments, the processing device 12 may include one or more sub-processing devices (e.g., a single-core processing device or a multi-core multi-core processing device).

The storage 14 may store data or information generated by other devices. In some embodiments, the storage 14 may store data and/or information generated by other components in the system 10 (e.g., the medical imaging device 11, the processing device 12). The storage 14 may include one or more storage components, each of which may be an independent device or may be part of other devices. The storage devices may be local or implemented through a cloud.

The terminal 13 may control the operation of the medical imaging device 11. The physician may give an operational instruction to the medical imaging device 11 through the terminal 13 to cause the medical imaging device 11 to perform a specified operation, such as, for example, irradiating a specified body part of a patient for imaging. In some embodiments, the terminal 13 may be one of a mobile device 131, a tablet computer 132, a laptop computer 133, a desktop computer, and other devices having input and/or output capabilities, or any combination thereof. In some embodiments, the voltage calibration device shown in some embodiments of the present disclosure may be provided in the processing device 12 or be implemented by some of the devices in the processing device 12, and the voltage calibration device may also be implemented by an independently provided terminal 13.

The network 15 may connect components of the system and/or connect the system to external resource components. The network 15 enables communication between the components, and with other components outside of the system, facilitating the exchange of data and/or information. In some embodiments, one or more components of the system 10 (e.g., the medical imaging device 11, the processing device 12, the storage 14, the terminal 13) may send data and/or information to other components via the network 15. In some embodiments, the network 15 may be any one or more of a wired network or a wireless network.

It should be noted that the foregoing description is provided for illustrative purposes only and is not intended to limit the scope of the present disclosure. For a person of ordinary skill in the art, a variety of variations and modifications may be made under the guidance of the contents of the present disclosure. The features, structures, methods, and other characteristics of the exemplary embodiments described in the present disclosure may be combined in various ways to obtain additional and/or alternative exemplary embodiments. For example, the processing device 12 may be based on a cloud computing platform, such as a public cloud, a private cloud, a community and hybrid cloud, etc. However, these variations and modifications will not depart from the scope of the present disclosure.

Figure 2:
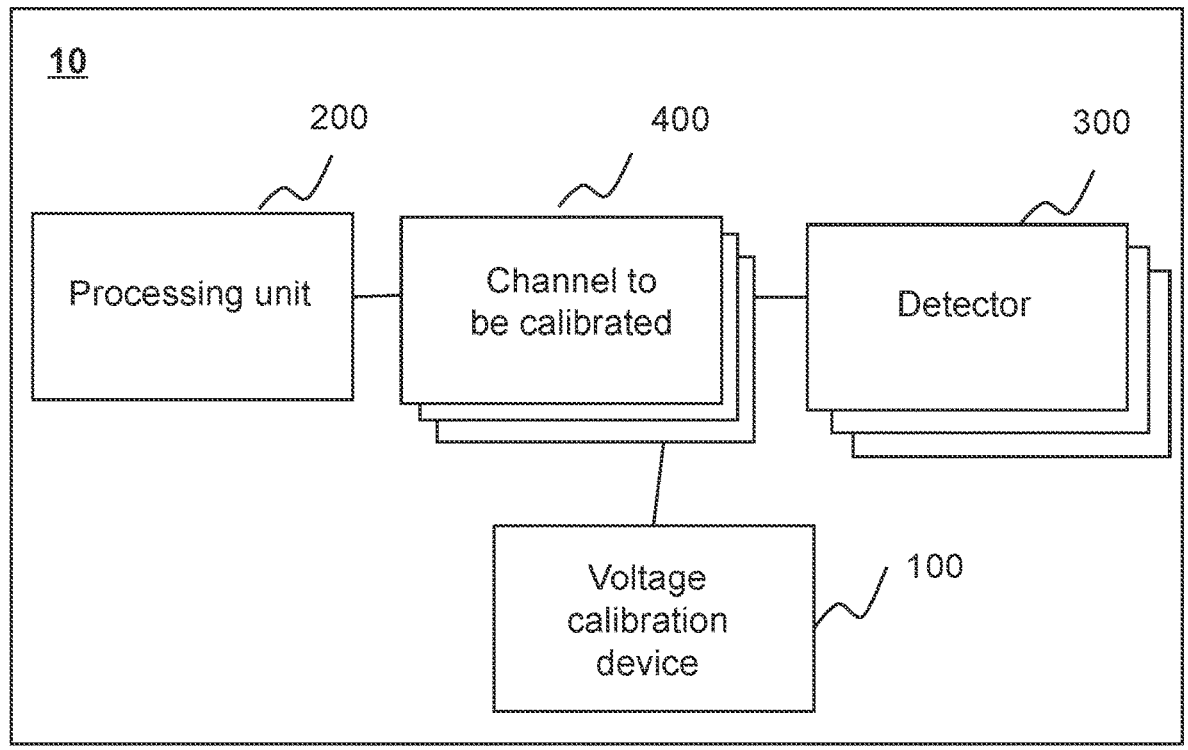
FIG. 2 is a schematic diagram illustrating a structure of an imaging system according to some embodiments of the present disclosure.

FIG. 2 is a schematic diagram illustrating a structure of an imaging system according to some embodiments of the present disclosure. In some embodiments, the imaging system 10 may include: a processing unit 200 (e.g., a processor), multiple detectors 300, multiple channels 400 to be calibrated, and a voltage calibration device 100. The processing unit 200 is connected to the multiple detectors 300 via the multiple channels 400 to be calibrated, each channel 400 to be calibrated is connected to a corresponding detector 300, and the voltage calibration device 100 is connected to the channel 400 to be calibrated. The voltage calibration device 100 is connected to the channel 400. In some embodiments, the processing unit 200 may obtain a detection signal of the detector 300 through the channel 400 to be calibrated, and the voltage calibration device 100 may adjust the common mode voltages of the multiple channels 400 to be calibrated.

The processing unit 200 may be a circuit unit with a data processing function. In some embodiments, the processing unit 200 may be a circuit unit such as an integrated circuit ASIC, a field programmable gate array (FPGA), etc. In some embodiments, the processing unit 200 may obtain a signal, data, etc. from the detector 300 through a readout channel. For example, the integrated circuit ASIC may obtain light signals detected by multiple detectors SiPM through multiple channels.

The detector 300 may be an apparatus for collecting data. In some embodiments, the detector 300 may include one or more of a photodetector (e.g., a silicon photomultiplier SiPM, a vacuum phototube, etc.), an acoustic detector (e.g., an oscillation detector, an ultrasound detector, etc.), a temperature detector (e.g., a thermistor, an infrared detector, etc.), or the like. In some embodiments, when multiple detectors 300 are provided, the multiple detectors 300 may transmit data collected by themselves separately to the processing unit 200 for processing. In some embodiments, the detector 300 may obtain gamma rays or other forms of rays (e.g., rays of particles such as α, β rays, etc. that differ in energy from gamma rays). Correspondingly, in some embodiments, the type and material of the detector crystal may be selected according to the signals desired to be obtained. Also, the circuit structure and parameters (e.g., preset stepping voltage, etc.) within the voltage calibration device 100 described hereinafter may be adjusted according to different forms of rays. For example, the operating voltage of the main amplifier within the voltage calibration device 100 can be adjusted.

The channel may be a pathway for transmitting data. In some embodiments, the channel between the processing unit 200 and the detector 300 may be a channel to transmit data, such as transmitting an instruction, an electrical energy, or a detection signal. For example, a channel between the integrated circuit ASIC and the detector is capable of transmitting a light signal detected by the detector. In some embodiments, when there are multiple channels, the multiple channels may be connected to the multiple detectors 300 in one-to-one correspondence. In some embodiments, the channel to be calibrated may adjust the common mode voltage of each channel connected to a detector.

The common mode voltage is an average voltage that occurs between a conductor and a defined reference point (e.g., earth or frame, etc.). In some embodiments, the common mode voltage of the channel 400 to be calibrated is a voltage across the channel 400 to be calibrated with the detector 300 at rest. For example, the common mode voltage of the channel 400 to be calibrated is a voltage across the channel with the detector not accepting photons.

In some embodiments, the voltage calibration device 100 may calibrate the common mode voltages of the multiple channels 400 to be calibrated such that the common mode voltages of the multiple channels 400 after being calibrated (hereinafter referred to as the calibrated common mode voltages) are close to each other, thereby ensuring that the multiple detectors 300 as a whole can operate stably and improving the overall performance of the imaging system 10. The detailed calibration process of the voltage calibration device 100 can be found in FIGS. 3-8 below, and is not repeated here.

It should be noted that the voltage calibration device 100 may be applied not only to the imaging system 10, but also to other systems where a voltage needs to be adjusted. In some embodiments, the voltage calibration device 100 may also be applied to other systems that need to adjust voltage values of multiple apparatuses or channels to be close, thereby allowing for the elimination of mismatches between multiple apparatuses and/or channels and improving the consistency of the apparatuses and/or channels. For example, the voltage calibration device 100 may be applied to a communication system to adjust voltages of multiple communication channels such that the voltages of the multiple communication channels are close to each other. For example, the voltage calibration device 100 may be applied in a co-working system to adjust voltages of multiple co-working apparatuses such that the voltages of the multiple co-working apparatuses are close.

Figure 3:
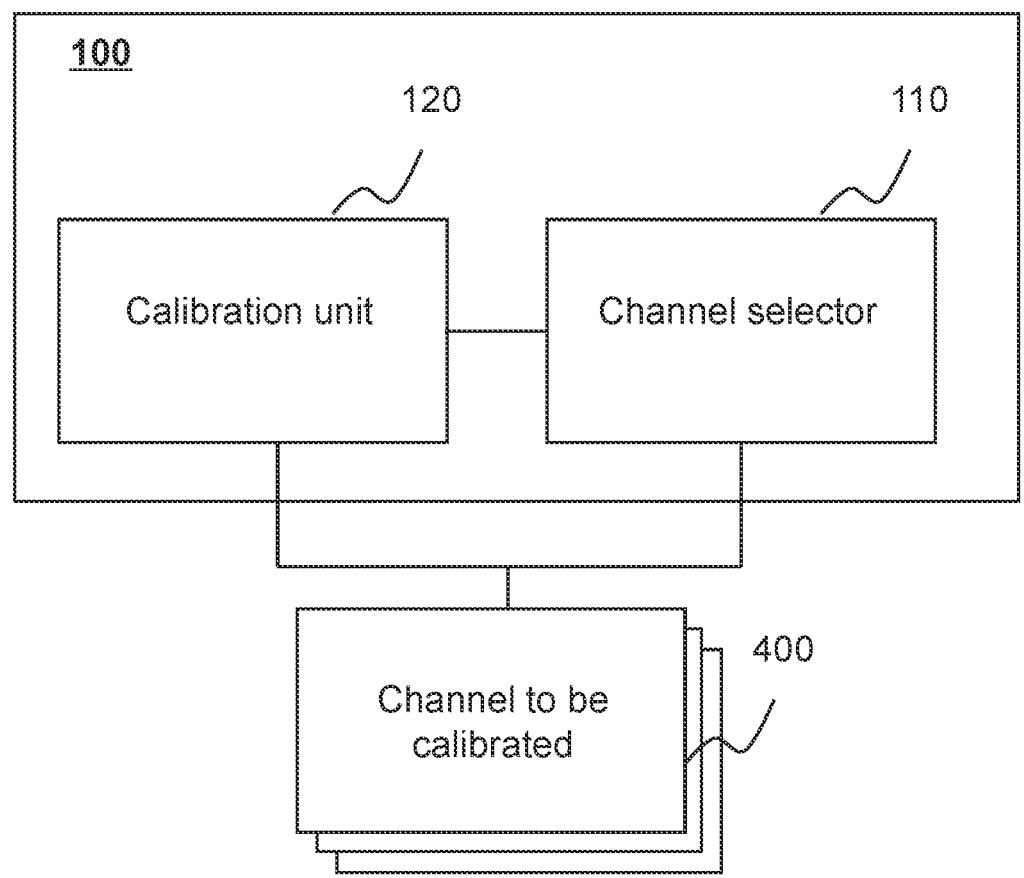
FIG. 3 is a schematic diagram illustrating a structure of a voltage calibration device according to some embodiments of the present disclosure.

FIG. 3 is a schematic diagram illustrating a structure of a voltage calibration device according to some embodiments of the present disclosure.

In some embodiments, as shown in FIG. 3, the voltage calibration device 100 may include: a channel selector 110 and a calibration unit 120. An input end of the channel selector 110 is selectively connected to channels to be calibrated of multiple detectors 300 to receive a common mode voltage of at least one of the channels to be calibrated. A first input end of the calibration unit 120 is connected to an output end of the channel selector 110, and an output end of the calibration unit 120 is connected to the multiple channels to be calibrated. The calibration unit 120 adjusts common mode voltages of the channels to be calibrated to relatively consistent calibrated common mode voltages to avoid the influence of different common mode voltages of the multiple channels to be calibrated on detection results. In some embodiments, the calibrated common mode voltage of each of the channels to be calibrated is within a preset voltage range.

In some embodiments, the channel selector 110 is controller that performs operations of selection. In some embodiments, the channel selector 110 may select one of the multiple channels to be calibrated for voltage adjustment. In some embodiments, the channel selector 110 may include a voltage selector, a current selector, or other acquisition control apparatus. In some embodiments, the channel selector 110 may be a voltage selector capable of obtaining and outputting a common mode voltage in the channel to be calibrated for a subsequent adjustment of the common mode voltage.

In some embodiments, the channel selector 110 may further receive an end-of-calibration signal to end an adjustment of the common mode voltage of the channel to be calibrated. In some embodiments, the channel selector 110 may also store the calibrated common mode voltage corresponding to each channel to be calibrated. Further, the channel selector 110 may store the calibrated common mode voltage in the event that the end-of-calibration signal is received. In this way, when the channel to be calibrated is subsequently used, the voltage calibration device 100 may directly adjust the common mode voltage of the channel to the calibrated common mode voltage based on the stored calibrated common mode voltage.

In some embodiments, the channel selector 110 (or other component of the imaging system 10, e.g., the storage 14) may store the common mode voltage of the channel to be calibrated. When the channel is subsequently needed for operation, the stored calibrated common mode voltage corresponding to that channel may be obtained, and the common mode voltage of that channel may be adjusted based on the calibrated common mode voltage. In some embodiments, the channel selector 110 may store the calibrated common mode voltage in a non-transitory storage manner. In this case, each time the channel is powered up, the channel selector 110 may quickly read out the non-transitory stored calibrated common mode voltage and adjust the common mode voltage of the channel to be calibrated, thus eliminating the need to calibrate each time it is powered up. The specific implementation of the channel selector 110 can be found in the relevant description in FIG. 4 below and is not repeated here.

In order to maintain a stable operation of the imaging system, in some embodiments, the voltage calibration device 100 may check and/or update the non-transitory stored common mode voltages. Further, in some embodiments, the voltage calibration device 100 may periodically calibrate the non-transitory stored common mode voltages corresponding to the multiple channels to be calibrated so that the calibrated common mode voltages of the multiple channels to be calibrated are within the preset voltage range.

In some embodiments, the voltage calibration device 100 may further include a register, which is connected to or belongs to the channel selector 110, and the channel selector 110 may send the calibrated common mode voltage of each channel to be calibrated and an identification of the corresponding channel to be calibrated to the register for the subsequent adjustment of the common mode voltage of that channel to be calibrated. In some embodiments, the register may be a unit or component with a storage function in the voltage calibration device 100, or it may be a device independent from the voltage calibration device 100. Correspondingly, in some embodiments, the calibrated common mode voltage corresponding to the channel to be calibrated may be stored within the channel selector 110, or may be stored in other devices outside the channel selector 110. In some embodiments, the register may store a digital signal corresponding to this calibrated common mode voltage for subsequent sending to a digital-to-analog converter 1231 for adjustment.

The calibration unit 120 may be a circuit capable of adjusting the common mode voltage. In some embodiments, the calibration unit 120 may adjust the common mode voltage according to a preset voltage range. In some embodiments, the calibration unit 120 may receive the common mode voltage output from the channel selector 110 and adjust the common mode voltage to a calibrated common mode voltage. The calibrated common mode voltages of the multiple channels to be calibrated are within the preset voltage range. For example, the calibration unit 120 may adjust the common mode voltage of one channel to be calibrated, and after adjusting the common mode voltage to the calibrated common mode voltage, the calibration unit 120 may continue to adjust the common mode voltage of the next channel to be calibrated so that the calibrated common mode voltages of all channels to be calibrated are within the preset voltage range, i.e., the multiple calibrated common mode voltages are close to each other, thereby improving the consistency of the channels.

In some embodiments, the preset voltage range is a predetermined common mode voltage range that may be used to limit a collectivity of the calibrated common mode voltages of the multiple channels to be calibrated. In some embodiments, the smaller the scope of the preset voltage range is, the closer the calibrated common mode voltages of the multiple channels to be calibrated are and the more consistent the channels are, and conversely, the larger the scope of the preset voltage range is, the more discrete the calibrated common mode voltages of the multiple channels to be calibrated are and the less consistent the channels are. For example, the preset voltage range may be [0.9V, 1.1V], or [0.147V, 0.153V], or [1.999V, 2.001V]. When the scope of the preset voltage range is smaller, the calibrated common mode voltages of the multiple channels to be calibrated are correspondingly closer. In some embodiments, the preset voltage range may be set according to the actual required channel consistency.

In some embodiments, the calibration unit 120 may adjust each common mode voltage to cause the calibrated common mode voltage to be within the preset voltage range based on a comparison result of the common mode voltage to be calibrated with the preset voltage range. For example, if the common mode voltage of the channel to be calibrated is less than a lower limit of the preset voltage range, the calibration unit 120 may incrementally increase the common mode voltage until the calibrated common mode voltage is within the preset voltage range.

In some embodiments, the calibration unit 120 may adjust the common mode voltage based on a target channel voltage so that the calibrated common mode voltage is within the preset voltage range. In some embodiments, a second input end of the calibration unit 120 receives the target channel voltage, and the calibration unit 120 adjusts the common mode voltage of the channel to be calibrated to the calibrated common mode voltage based on the comparison result of the target channel voltage and the common mode voltage. After calibration, the difference between the calibrated common mode voltages of the multiple channels to be calibrated and the target channel voltages is less than a preset voltage threshold.

In some embodiments, the target channel voltage may be a predetermined common mode voltage, which may characterize a target value for which the common mode voltage needs to be adjusted. In some embodiments, the target channel voltage may be an average of historical common mode voltages of the channels, or it may be an initial common mode voltage of a particular channel, or it may be a common mode voltage artificially set by a user, which is not specifically limited by the embodiments of the present disclosure.

In some embodiments, the calibration unit 120 may adjust the common mode voltages of the multiple channels to be calibrated to be close to that target channel voltage such that the multiple calibrated common mode voltages are all close to the target channel voltage, thereby improving the consistency of the channels. In some embodiments, for a channel to be calibrated, the calibration unit 120 may adjust the common mode voltage of the channel to be calibrated so that the calibrated common mode voltage is close to the target channel voltage based on the comparison result of the target channel voltage and the common mode voltage. For example, when the common mode voltage is greater than the target channel voltage, the calibration unit 120 may reduce the common mode voltage of the channel 400 to be calibrated so that the common mode voltage after calibration (i.e., the calibrated common mode voltage) is close to the target channel voltage.

In some embodiments, the difference between the calibrated common mode voltage and the target channel voltage may characterize a difference between the calibrated common mode voltage and the target value. For example, a smaller difference indicates that the calibrated common mode voltage is closer to the target channel voltage. In some embodiments, a preset voltage threshold may be used to limit the difference between the calibrated common mode voltage and the target channel voltage. In some embodiments, the smaller the preset voltage threshold is, the closer the calibrated common mode voltages of the multiple channels to be calibrated are, and the higher the consistency of the channels is, and conversely, the larger the preset voltage threshold is, the more discrete the calibrated common mode voltages of the multiple channels 400 to be calibrated are, and the lower the consistency of the channels is. In some embodiments, the preset voltage threshold may be set based on the preset voltage range or the actual required channel consistency.

In some embodiments, for each channel to be calibrated, the calibration unit 120 may adjust the common mode voltage in an iterative way. In each cycle (or iteration), the calibration unit 120 may adjust the common mode voltage until a preset condition is met to stop the cycle. Then, the calibration unit 120 may turn to a next channel to be calibrated and adjust the corresponding common mode voltage. In some embodiments, the calibration unit 120 adjusts the common mode voltage of the channel to be calibrated by varying a preset stepping voltage based on the comparison result of the target channel voltage and the common mode voltage.

In some embodiments, the preset stepping voltage is a fixed voltage value. For example, the preset stepping voltage may be 2 mv, and the common mode voltage of a channel may be adjusted to vary by 2 mv in each cycle. In some embodiments, the preset stepping voltage may be 100 mV, 5 mV, 3 mV, or 1 mV, etc., which are not specifically limited by the present disclosure. In some embodiments, the preset stepping voltage may correspond to the preset voltage threshold. In some embodiments, the preset stepping voltage may be determined based on the preset voltage threshold, and the preset stepping voltage may be used to limit a maximum difference between the calibrated common mode voltage and the target channel voltage. In some embodiments, the preset stepping voltage may be less than or equal to the preset voltage threshold. For example, the preset voltage threshold may be 100 mV, 5 mV, or 3 mV, etc., and the preset stepping voltage may be 100 mV, 5 mV, 3 mV, or 1 mV, etc.

In some embodiments, the calibration unit 120 may be used to: adjust the common mode voltage to increase by a preset stepping voltage when the common mode voltage is less than the target channel voltage so that the common mode voltage after calibration becomes larger to approach the target channel voltage. Similarly, when the common mode voltage is greater than the target channel voltage, the calibration unit 120 may adjust the common mode voltage to decrease by the preset stepping voltage so that the common mode voltage after calibration becomes smaller to approach the target channel voltage.

In some embodiments, the calibration unit 120 may stop adjusting the common mode voltage of a specific channel after a change in the comparison result. Since the value of the common mode voltage needs to be adjusted once in each cycle, and the adjustment stops when the comparison result changes, it is possible to make the difference between the calibrated common mode voltage and the target channel voltage less than the preset stepping voltage. In some embodiments, the calibration unit 120 may end the calibration if the common mode voltage in the current comparison (i.e., the comparison in current cycle) is greater than or equal to the target channel voltage and the last comparison result (i.e., the comparison in last cycle) is that the common mode voltage is less than the target channel voltage; or the calibration unit 120 may end the calibration if the common mode voltage in the current comparison is less than or equal to the target channel voltage and the last comparison result is that the common mode voltage is greater than the target channel voltage. For example, assuming the preset stepping voltage is 5 mV, and the previous comparison results are that the common mode voltages are less than the target channel voltages, if the adjusted common mode voltage is greater than or equal to the target channel voltage for the first time, which means that the comparison results have changed, the cycle can be stopped, and the difference between the calibrated common mode voltage and the target channel voltage may be less than the changed 5 mV at this time (i.e., less than the preset stepping voltage).

In some embodiments, the variation tendency of the common mode voltage may be determined based on the comparison result of the target channel voltage and the common mode voltage. For example, in the case where the initial common mode voltage of the channel to be calibrated is greater than the target channel voltage, the calibration unit 120 may reduce the common mode voltage of that channel to be calibrated by the preset stepping voltage. Conversely, if the initial common mode voltage of the channel to be calibrated is less than the target channel voltage, the calibration unit 120 may increase the common mode voltage of the channel to be calibrated by the preset stepping voltage.

In some embodiments, the above cycle may include: (1) the calibration unit 120 obtains a comparison result of the target channel voltage and the common mode voltage. (2) The calibration unit 120 adjusts the common mode voltage to vary a preset stepping voltage based on the comparison result. A preset condition may be a change of the comparison result. In some embodiments, when the preset condition is met, it means that the difference between the calibrated common mode voltage and the target channel voltage is less than a preset voltage threshold. In the case where the preset condition is not met, the calibration unit 120 may repeat (1)-(2) above using the changed common mode voltage as the common mode voltage in the next cycle. In the case that the preset condition is met, i.e., the comparison result changes, the calibration unit 120 may stop adjusting the common mode voltage, at which time the most updated common mode voltage of the channel to be calibrated is the calibrated common mode voltage.

In this way, the common mode voltage for each of the channels to be calibrated may be adjusted in a step manner to approach the target channel voltage, and the adjustment is stopped when the comparison result changes, thus ensuring that the calibrated common mode voltages of the multiple channels to be calibrated have a small difference from the target channel voltage, and thus improving the overall consistency of the channels and improving the detection performance of the detector 300.

An exemplary channel selector 110 and calibration unit 120 that can implement the cycling described above is provided below in conjunction with FIG. 4.

Figure 4:
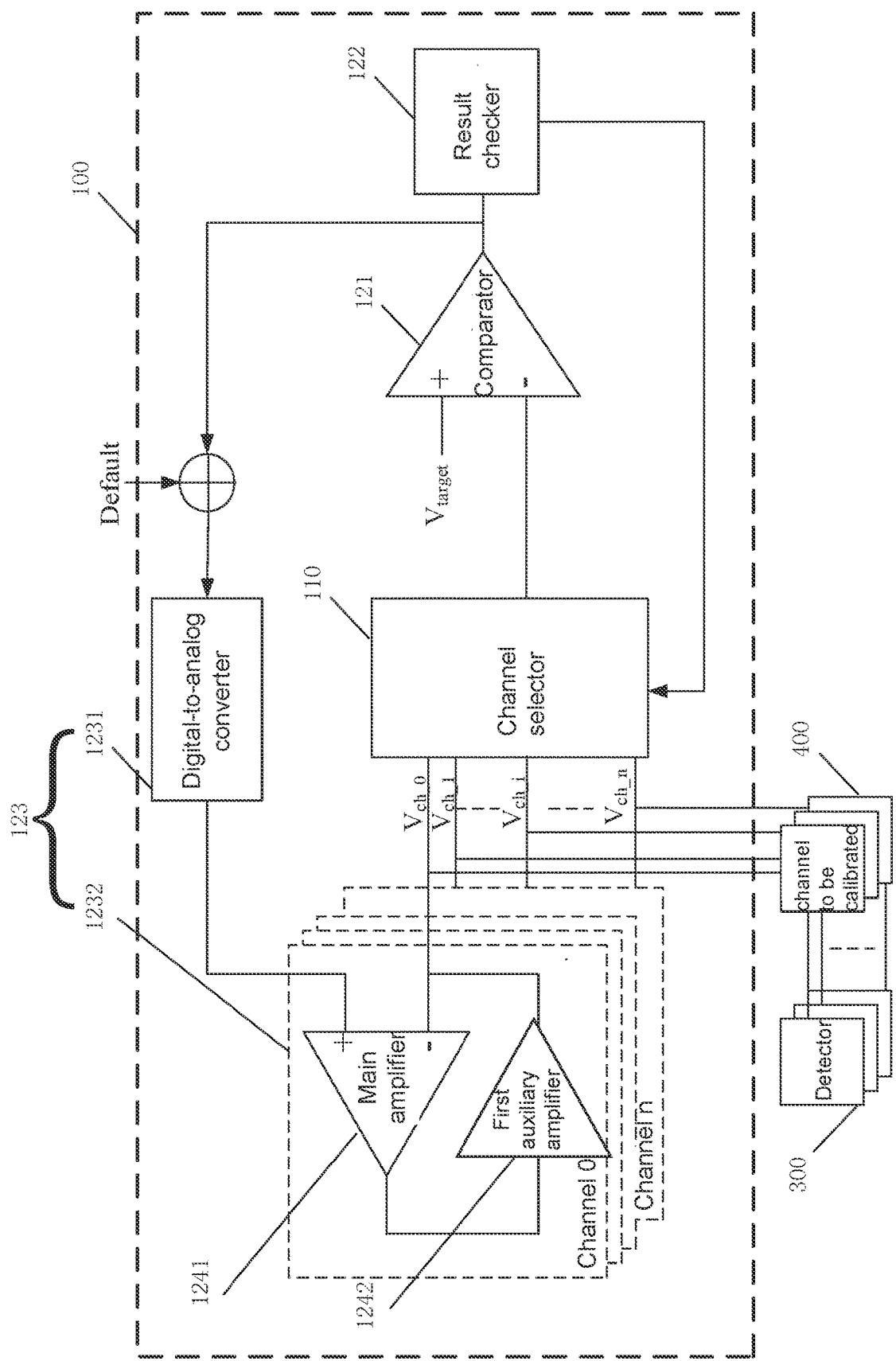
FIG. 4 is a schematic diagram illustrating a circuit structure of a voltage calibration device according to some embodiments of the present disclosure.

FIG. 4 is a schematic diagram illustrating a circuit structure of a voltage calibration device according to some embodiments of the present disclosure. In some embodiments, as shown in FIG. 4, the channel selector 110 may be an one-to-multiple voltage selector, and the channel selector 110 may be selectively connected to one of the multiple channels to be calibrated. The channel selector 110 may select an $i_{th}$ channel to be calibrated from the n channels to be calibrated, obtain and output the common mode voltage $V_{ch\_i}$ of the $i_{th}$ channel to be calibrated, and adjust the common mode voltage $V_{ch\_i}$ of that channel to be calibrated, with i being a positive integer greater than 0 and less than or equal to n.

In some embodiments, as shown in FIG. 4, the calibration unit 120 may include a comparator 121 and a result checker 122. A first input end of the comparator 121 receives the common mode voltage $V_{ch\_i}$ of the channel to be calibrated, a second input end of the comparator 121 receives a target channel voltage $V_{target}$, and an output end of the comparator 121 outputs a calibration signal to adjust the common mode voltage $V_{ch\_i}$ to vary a preset stepping voltage, and the calibration signal is determined according to a comparison result of the common mode voltage $V_{ch\_i}$ with the target channel voltage $V_{target}$. An input end of the result checker 122 is connected to the output end of the comparator 121, which sends an end-of-calibration signal corresponding to the channel to be calibrated to the channel selector 110 in case a change of the comparison result is detected.

The comparator 121 is a device that compares an analog voltage signal to a reference voltage. In some embodiments, the comparator 121 may be a voltage comparator. In some embodiments, the first input end of the comparator 121 may be connected to the output end of the channel selector 110 to receive the common mode voltage of the channel to be calibrated selected by the channel selector 110. In some embodiments, the output end of the comparator 121 may be connected to the result checker 122 and the at least one voltage controller 123 to output a calibration signal, respectively.

In some embodiments, the calibration signal may be a digital signal characterizing the comparison result of the common mode voltage and the target channel voltage, which form the basis of the subsequent adjustment of the common mode voltage, for example, a value of +1 for the calibration signal may characterize the common mode voltage as being less than the target channel voltage, and a value of −1 for the calibration signal may characterize the common mode voltage as being greater than the target channel voltage. The specific implementation of adjusting the common mode voltage according to the calibration signal can be found in the relevant description in the feedback amplifier circuit 1232 below, and is not repeated here.

The result checker 122 may be a device that detects a change in a signal, such as checking for a change in a calibration signal. In some embodiments, the result checker 122 may be a digital level detector, a voltage detector, etc., and the result checker may be selected based on the type of a calibration signal. In some embodiments, the result checker 122 may be used to: send the end-of-calibration signal if the common mode voltage in the current comparison is greater than or equal to the target channel voltage, and the last comparison result is that the common mode voltage is less than the target channel voltage; or send the end-of-calibration signal if the common mode voltage is less than or equal to the target channel voltage, and the last comparison result is that the common mode voltage is greater than the target channel voltage. In some embodiments, the result checker 122 may use the default register values or the last output calibration signal output by the comparator 121 as a reference, compare the subsequent calibration signal output by the comparator 121 with the reference calibration signal, and output an end-of-calibration signal based on the comparison result. For example, if the result checker 122 uses the default register values with a value of −1 as a reference, and when the value of the subsequent calibrated signal changes to +1, then the result checker 122 may output the end-of-calibration signal. As another example, if the result checker 122 uses the calibration signal with a value of +1 as a reference, and when the value of the subsequent calibration signal changes to −1, the result checker 122 may output the end-of-calibration signal.

In some embodiments, the input end of the result checker 122 may be connected to the output end of the comparator 121 to receive a calibration signal. In some embodiments, the output end of the result checker 122 may be connected to the channel selector 110 for outputting an end-of-calibration signal. The result checker 122 may obtain the calibration signal output by the comparator 121 and output the end-of-calibration signal in case the calibration signal changes.

The end-of-calibration signal may be a signal that identifies the end of the adjustment of the common mode voltage of the channel to be calibrated. In some embodiments, the result checker 122 may reset its own state upon outputting the end-of-calibration signal for a subsequent calibration of another channel to be calibrated. In some embodiments, the channel selector 110 may stop obtaining the common mode voltage of a specific channel to be calibrated when it receives the end-of-calibration signal corresponding to the specific channel, thereby stopping the adjustment of the common mode voltage of that channel to be calibrated. In some embodiments, the channel selector 110, upon receiving the end-of-calibration signal, may select another channel to be calibrated for connection to continue adjusting the common mode voltage of the newly-selected channel. In some embodiments, the channel selector 110 may also store the calibrated common mode voltage of the channel to be calibrated when it receives this end-of-calibration signal. The specific implementation of the channel selector 110 can be found in the relevant description in FIG. 3 above and is not repeated here.

In this way, by determining the variation tendency of the common mode voltage in the above cycle by the comparator 121 and by determining whether the preset condition for stopping the cycle is met by the result checker 122, it is possible to achieve a cyclic step adjustment of the common mode voltage to ensure that the calibrated common mode voltage corresponding to each channel is close to the target channel voltage, thus ensuring that the different calibration channels end up with the same or close calibrated common mode voltage.

In some embodiments, when multiple comparators 121 are provided, the input ends of the multiple comparators 121 are selectively connected to the channel selector 110, and the output ends of the multiple comparators 121 are all connected to the result checker 122. Each comparator 121 may correspond to a different channel to individually process the common mode voltage of the corresponding channel. In some embodiments, when only one comparator is provided, the input end of the comparator 121 is connected to the channel selector 110, and the output end of the comparator 121 is connected to the result checker 122.

In some embodiments, multiple preset stepping voltages may be provided. In the case of a large difference between the common mode voltage and the target channel voltage, a larger preset stepping voltage may be used to adjust the common mode voltage. In the case where the difference between the common mode voltage and the target channel voltage is small, a smaller preset stepping voltage may be used to adjust the common mode voltage.

In some embodiments, multiple preset stepping voltages includes a first stepping voltage and a second stepping voltage, and the first stepping voltage and the second stepping voltage are different. The calibration unit 120 adjusts the common mode voltage to vary one of the preset stepping voltages based on each comparison result of the target channel voltage and the common mode voltage until the adjustment stops after the comparison result changes. For example, the calibration unit 120 selects the first stepping voltage or the second stepping voltage to adjust the common mode voltage based on each comparison result of the difference between the target channel voltage and the common mode voltage and a preset voltage difference range, so that the adjusted common mode voltage is close to the target channel voltage, until the adjustment is stopped after a flip of the difference between the target channel voltage and the common mode voltage.

The first stepping voltage and the second stepping voltage may be preset stepping voltages with different voltage values. In some embodiments, in the case where the first stepping voltage is greater than the second stepping voltage, the second stepping voltage may be determined based on a preset voltage difference range. For example, the first stepping voltage may be 10 mV and the second stepping voltage may be 3 mV. The preset voltage difference range may be a preset range of the difference between the target channel voltage and the common mode voltage, which may be used to qualify a selection condition for the first stepping voltage or the second stepping voltage.

In some embodiments, different preset stepping voltages may be selected based on the needs of different scenarios. In some embodiments, the magnitude of the preset stepping voltage may be changed during the calibration process. In some optional embodiments, the preset stepping voltage may be reduced in each cycle such that the calibrated common mode voltage of a channel to be calibrated can be further approximate to the target channel voltage signal to improve the accuracy of the calibration. For example, the preset stepping voltage is 5 mV for the first cycle, 4 mV for the second cycle, and so on. In some optional embodiments, a larger preset stepping voltage may be used for adjustment in initial one or more cycle, thereby reducing the number of cycles of the calibration and improving the efficiency of the calibration. For example, the preset stepping voltage at the first cycle may be 10 mv.

In some embodiments, a different preset stepping voltage may be selected based on a photon energy detected by the detector 300. For example, when the photon energy detected by the detector 300 is large, a preset stepping voltage with a larger value (e.g., the first stepping voltage described above) may be selected; when the photon energy detected by the detector 300 is small, a preset stepping voltage with a smaller value (e.g., the second stepping voltage described above) may be selected. In some embodiments, the detector 300 may instruct the voltage calibration device 100 to adjust the preset stepping voltage when the photon energy changes. Further, in some embodiments, the detector 300 may establish communication with the voltage calibration device 100 via a network (such as the network 15 shown in FIG. 1), thereby transmitting an instruction to the voltage calibration device 100 to instruct the voltage calibration device 100 to adjust the preset stepping voltage.

In some embodiments, the calibration unit 120 may select a first stepping voltage or a second stepping voltage to adjust the common mode voltage based on the comparison result of the difference between the target channel voltage and the common mode voltage with the preset voltage difference range. For example, when the difference is outside the preset voltage difference range, the first stepping voltage may be selected to adjust the common mode voltage to quickly reduce the difference between the common mode voltage and the target channel voltage to improve the adjustment efficiency. When the difference is within the preset voltage difference range, the second stepping voltage may be selected to adjust the common mode voltage to improve the adjustment accuracy of the common mode voltage. An exemplary calibration unit 120 that implements the above multiple preset stepping voltages is provided below.

In some embodiments, the calibration unit 120 includes a comparator 121 and a processor. A first input end of the comparator 121 receives the common mode voltage of the channel to be calibrated, a second input end receives the target channel voltage, and an output end of the comparator 121 outputs the difference between the target channel voltage and the common mode voltage. An input end of the processor is connected to at least the output end of the comparator 121, which determines the comparison result of the difference between the target channel voltage and the common mode voltage with the preset voltage difference range, selects a first stepping voltage or a second stepping voltage to adjust the common mode voltage, and sends an end-of-calibration signal corresponding to the channel to be calibrated to the channel selector 110 if a flip of the difference is detected.

In some embodiments, the comparator 121 may output a signal corresponding to the difference between the target channel voltage and the common mode voltage for the processor to adjust the stepping voltage based on the difference.

The processor may be an electronic device having a data processing function. The processor is similar in structure and function to the processing unit 200 described above, and the specific implementation of the processor can be found in the relevant description of the processing unit 200 described above and is not repeated here. In some embodiments, the processor may choose the first stepping voltage or the second stepping voltage to adjust the common mode voltage based on the comparison result of the difference and the preset voltage difference range. For example, if the difference between the target channel voltage and the common mode voltage is positive, the processor determines that the common mode voltage needs to be increased, and if the difference is outside of the preset voltage difference range, the processor adjusts the common mode voltage to increase the first stepping voltage.

In some embodiments, the processor may send an end-of-calibration signal corresponding to the channel to be calibrated to the channel selector 110 in the event that a flip in the sign of the difference is detected. For example, the end-of-calibration signal is output in the event that the difference between the target channel voltage and the common mode voltage changes from a positive value to a negative value. In some embodiments, the processor may be reset based on the end-of-calibration signal so that voltage adjustments can be made to the other channels to be calibrated.

In this way, the collaboration of the comparator 121 and the processor can be used to achieve a cyclic step adjustment of the common mode voltage, ensuring consistency of the multiple calibrated common mode voltages.

In some embodiments, the above calibration unit 120 may include at least one voltage controller 123. The input end of the voltage controller 123 is connected to the output end of the comparator 121, and the output end of the at least one voltage controller 123 is connected to the corresponding channel to be calibrated. The at least one voltage controller 123 adjusts the common mode voltages according to the comparison results, and then the first input end of the comparator 121 receives the adjusted common mode voltage for further comparison.

The at least one voltage controller 123 may be a circuit unit for adjusting a voltage. In some embodiments, the at least one voltage controller 123 may be a contact voltage regulator, a transistor regulator, an integrated circuit regulator, or a computer-controlled regulator, without being specifically limited by the present disclosure. In some embodiments, the at least one voltage controller 123 may adjust the common mode voltage based on the received calibration signal. For example, if the value of the calibration signal is +1 in one cycle, the at least one voltage controller 123 may control the common mode voltage of the channel to be calibrated by increasing by the preset stepping voltage, and the channel selector 110 may obtain the adjusted common mode voltage and send the adjusted common mode voltage to the first input end of the comparator 121 to proceed to the next cycle.

In some embodiments, when the channel is operating normally, the at least one voltage controller 123 may obtain the calibrated common mode voltage corresponding to the channel from a register and adjust the common mode voltage of the channel based on the calibrated common mode voltage, thereby eliminating the need to adjust the voltage again by cyclic stepping and improving the calibration efficiency of the channel.

An exemplary at least one voltage controller 123 that can achieve an adjustment of the common mode voltage is provided below.

In some embodiments, as shown in FIG. 4, the at least one voltage controller 123 includes a digital-to-analog converter 1231 (a voltage-based digital-to-analog converter as shown) and a feedback amplifier circuit 1232. An input end of the digital-to-analog converter 1231 is connected to at least an output end of the comparator 121, and the input end of the digital-to-analog converter 1231 receives a calibration signal. An input end of the feedback amplifier circuit 1232 is connected to at least the output end of the digital-to-analog converter 1231, and an output end of the feedback amplifier circuit 1232 is connected to at least the channel to be calibrated, and the feedback amplifier circuit 1232 adjusts the common mode voltage of the corresponding channel to be calibrated according to the analog signal.

The digital-to-analog converter 1231 is an electronic device that converts a digital signal to an analog signal. In some embodiments, the digital-to-analog converter 1231 may convert a digital quantity in parallel binary to a direct current voltage or a direct current. In some embodiments, the digital-to-analog converter 1231 may be one or a combination of one or more of a T-type resistive network D/A converter, a right resistive network D/A converter, a CMOS switching type D/A converter, and other devices. In some embodiments, the digital-to-analog converter 1231 may correspond to the channel to be calibrated in the one-to-one manner to adjust the common mode voltage of the corresponding channel. In some embodiments, the digital-to-analog converter may be a voltage-type digital-to-analog converter, which may output an analog voltage signal, or a current-type digital-to-analog converter, which may output an analog current signal.

In some embodiments, as shown in FIG. 4, the input end of the digital-to-analog converter 1231 also receives an initial signal Default and outputs a corresponding analog signal based on the initial signal Default and the calibration signal.

The initial signal Default may be a digital signal corresponding to an initial voltage signal. In some embodiments, a value of the initial signal Default may be a value such as a null value, a default value, etc. In some embodiments, the value of the initial signal Default may be a digital signal corresponding to a common mode voltage. For example, in the first cycle, the initial signal Default may be a digital signal corresponding to the initial common mode voltage of a channel, and in the nth cycle, the initial signal Default may be a digital signal corresponding to the adjusted common mode voltage in the last cycle.

The feedback amplifier circuit 1232 may be a collection of circuits in which an output signal is equivalent to an input signal, for example, the feedback amplifier circuit 1232 may control the output signal to follow a change in the input signal. In some embodiments, the voltage at the input end of the feedback amplifier circuit 1232 is the same as the voltage at the output end of the feedback amplifier circuit 1232, which can be considered as the input end being "connected" to the output end. In some embodiments, the feedback amplifier circuit 1232 may be a voltage follower, a current follower, or a collection of other circuits, and the present disclosure does not specifically limit this. In some embodiments, the structure of the feedback amplifier circuit 1232 may be designed according to the type of the digital-to-analog converter 1231.

The specific implementation of the digital-to-analog converter 1231 and the feedback amplifier circuit 1232 is described in detail below, using the voltage type digital-to-analog converter shown in FIG. 4 and the current-type digital-to-analog converter shown in FIG. 5 as examples.

In some embodiments, as shown in FIG. 4, the voltage-based analog-to-digital converter may adjust a corresponding analog voltage signal to vary a preset stepping voltage based on a calibration signal. For example, when the value of the calibration signal is +1, the voltage-based analog-to-digital converter may control the output analog voltage signal to increase the preset stepping voltage. Alternatively, when the value of the calibration signal is −1, the voltage-based analog-to-digital converter may control the output analog voltage signal to decrease the preset stepping voltage. In some embodiments, the magnitude of the preset stepping voltage may also be adjusted by adjusting parameters of the voltage-based analog-to-digital converter. The specific implementation of the preset stepping voltage can be found in the relevant description in the calibration unit 120 above and is not repeated here.

In some embodiments, the voltage-based analog-to-digital converter may determine an initial voltage signal based on the value of the initial signal Default, and then control the initial voltage signal to vary the preset stepping voltage based on the value of the calibration signal, thereby outputting an analog voltage signal. For example, if the initial voltage signal corresponding to the initial signal Default is 1.5 mV, and the value of the calibration signal is +1 and the preset stepping voltage is 0.3 mV, the digital-to-analog converter 1231 may control the value of the initial voltage signal 1.5 mV to increase by the value 0.3 mV of the preset stepping voltage, thereby outputting an analog voltage signal with a value of 1.8 mV.

In some embodiments, as shown in FIG. 4, the digital-to-analog converter 1231 (i.e., a voltage-based analog-to-digital converter) outputs an analog voltage signal, and the feedback amplifier circuit 1232 may include a main amplifier 1241 and a first auxiliary amplifier 1242. An positive input end of the main amplifier 1241 is connected to the output end of the digital-to-analog converter 1231, a negative input end of the main amplifier 1241 is connected to an output end of the first auxiliary amplifier 1242, and an output end of the main amplifier 1241 is connected to an input end of the first auxiliary amplifier 1242, and the output end of the first auxiliary amplifier 1242 is also connected to the corresponding channel to be calibrated to adjust the common mode voltage of the channel to be calibrated according to the analog voltage signal.

In some embodiments, the feedback amplifier circuit 1232 may adjust the voltage at the output end to be close to or consistent with the analog voltage signal based on the analog voltage signal received at the input end, thereby enabling the adjustment of the common mode voltage of the channel to be calibrated connected to the output end of the feedback amplifier circuit 1232. In this regard, the forward input end and the negative input end of the main amplifier 1241 are imaginary short, and the forward input end and the negative input end may be regarded as having a same voltage, so that a change in the voltage of the forward input end of the main amplifier 1241 may drive a change in the voltage of the negative input end. For example, if the value of the common mode voltage of the channel to be calibrated is 1.5V and the value of the analog voltage signal is 1.8V, the main amplifier 1241 may adjust the voltage at the negative input end of the main amplifier 1241 to 1.8V according to the 1.8V analog voltage signal received at the forward input end, so that the common mode voltage at the channel to be calibrated connected to the output end of the feedback amplifier circuit 1232 is also changed to 1.8V, which realizes the adjustment of the common mode voltage.

It should be noted that multiple feedback amplifier circuits 1232 may be provided to connect to the multiple channels to be calibrated, respectively. In some embodiments, the feedback amplifier circuits 1232 may be provided in the at least one voltage controller 123, and the multiple feedback amplifier circuits 1232 are respectively connected to the multiple channels to be calibrated to adjust the common mode voltages of the corresponding channels to be calibrated. As shown in FIG. 4, the feedback amplifier circuit 1232 of channel 0 may adjust a common mode voltage $V_{ch\_0}$ of the channel to be calibrated, and so on, and the feedback amplifier circuit 1232 of channel n may adjust a common mode voltage $V_{ch\_n}$ of the channel to be calibrated. In some optional embodiments, the multiple feedback amplifier circuits 1232 may be included in the corresponding channels to be calibrated separately.

Figure 5:
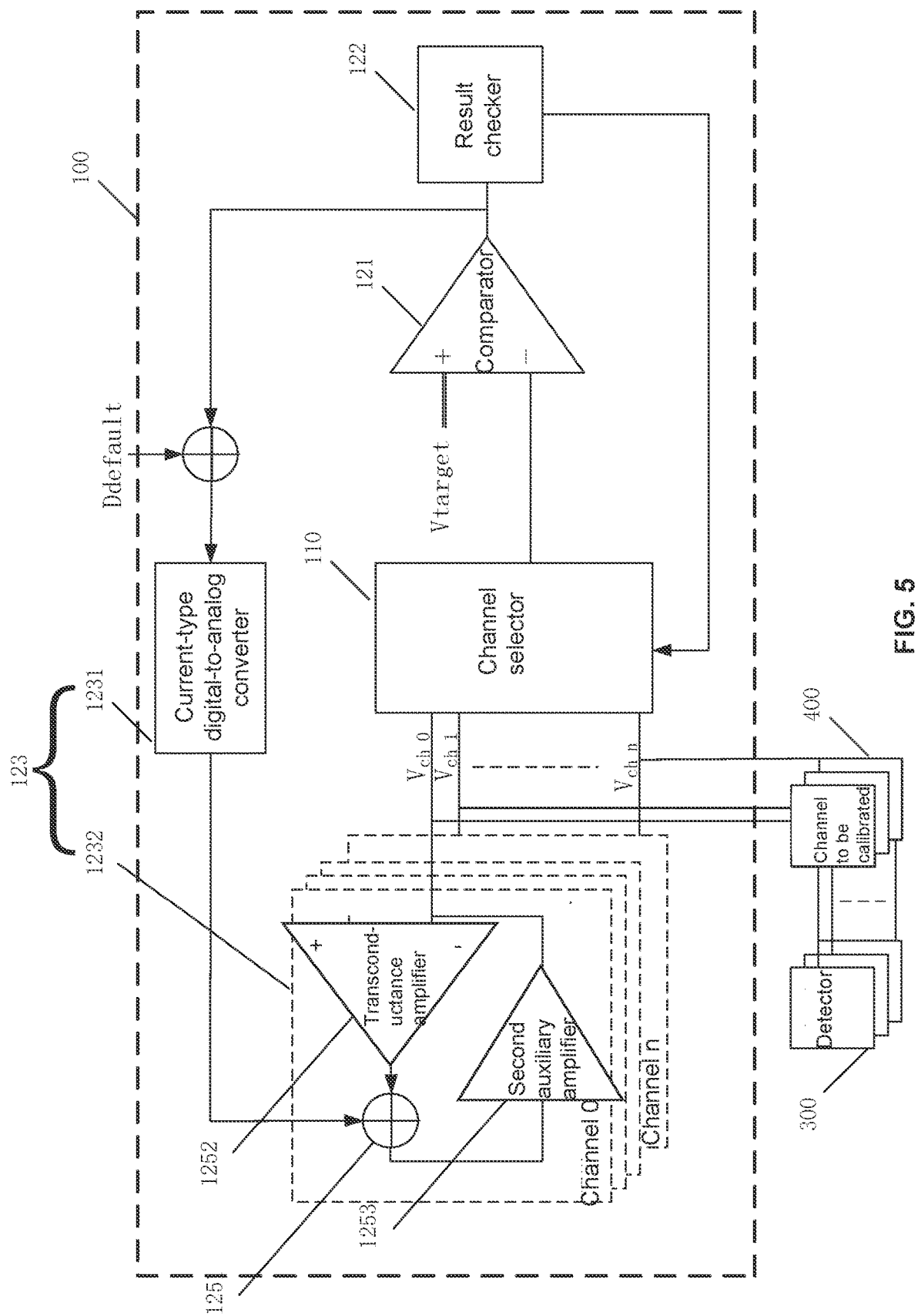
FIG. 5 is a schematic diagram illustrating a circuit structure of a voltage calibration device according to some embodiments of the present disclosure.

FIG. 5 is a schematic diagram illustrating a circuit structure of a voltage calibration device according to some embodiments of the present disclosure. In some embodiments, as shown in FIG. 5, the current-type analog-to-digital converter (IDAC) may adjust the corresponding analog current signal change according to the calibration signal to cause the voltage corresponding to the adjusted analog current signal to vary a preset stepping voltage. For example, when the value of the calibration signal is +1, the current-type analog-to-digital converter may control the output analog current signal to increase the preset step current so that the voltage corresponding to the adjusted analog current signal increases the preset stepping voltage. Alternatively, when the value of the calibration signal is −1, the current-type analog-to-digital converter may control the output analog current signal to reduce the preset step current so that the voltage corresponding to the adjusted analog current signal reduces the preset stepping voltage. In some embodiments, the magnitude of the preset step current may also be adjusted by adjusting the parameters of the current-type analog-to-digital converter. The specific implementation of the preset step current is similar to the specific implementation of the preset stepping voltage and can be found in the relevant description in FIG. 4 above.

In some embodiments, as shown in FIG. 5, the digital-to-analog converter 1231 (i.e., the current-type analog-to-digital converter IDAC) outputs an analog current signal, and the feedback amplifier circuit 1232 may include a summator 1251, a transconductance amplifier 1252 (GM), and a second auxiliary amplifier 1253, wherein a first input end of the summator 1251 is connected to the output end of the digital-to-analog converter 1231, a second input end of the summator 1251 is connected to an output end of the transconductance amplifier 1252, and an output end of the summator 1251 is connected to an input end of the second auxiliary amplifier 1253. The second input end of the summator 1251 is connected to the output end of the transconductance amplifier 1252, and the output end of the summator 1251 is connected to the input end of the second auxiliary amplifier 1253, and the summator 1251 is used to sum a current and an analog current signal of the channel to be calibrated; a negative input end of the transconductance amplifier 1252 is connected to an output end of the second auxiliary amplifier 1253, and the output end of the second auxiliary amplifier 1253 is also connected to the corresponding channel to be calibrated to adjust the common mode voltage of the channel to be calibrated according to the analog current signal.

In some embodiments, the feedback amplifier circuit 1232 may adjust the voltage at the output end to be close to or be consistent with the voltage corresponding to the analog current signal based on the analog current signal received at the input end, thereby enabling the adjustment of the common mode voltage of the channel to be calibrated that is connected to the output end of the feedback amplifier circuit 1232. Therein, the summator 1251 may sum the current at the output end of the transconductance amplifier 1252 and the analog current signal so that the second auxiliary amplifier 1253 may collaborate with the transconductance amplifier to adjust the common mode voltage of the channel 400 to be calibrated. The specific implementation of the feedback amplifier circuit 1232 can be found elsewhere in the present disclosure, e.g., as described in FIG. 4 and related descriptions.

In this way, through the collaboration of the digital-to-analog converter 1231 and the feedback amplifier circuit 1232, the output of the digital-to-analog converter 1231 may be adjusted according to the input calibration signal, and then the feedback amplifier circuit 1232 causes the output end to be aligned with the input end, thereby realizing the adjustment of the common mode voltage of the channel to be calibrated.

Figure 6:
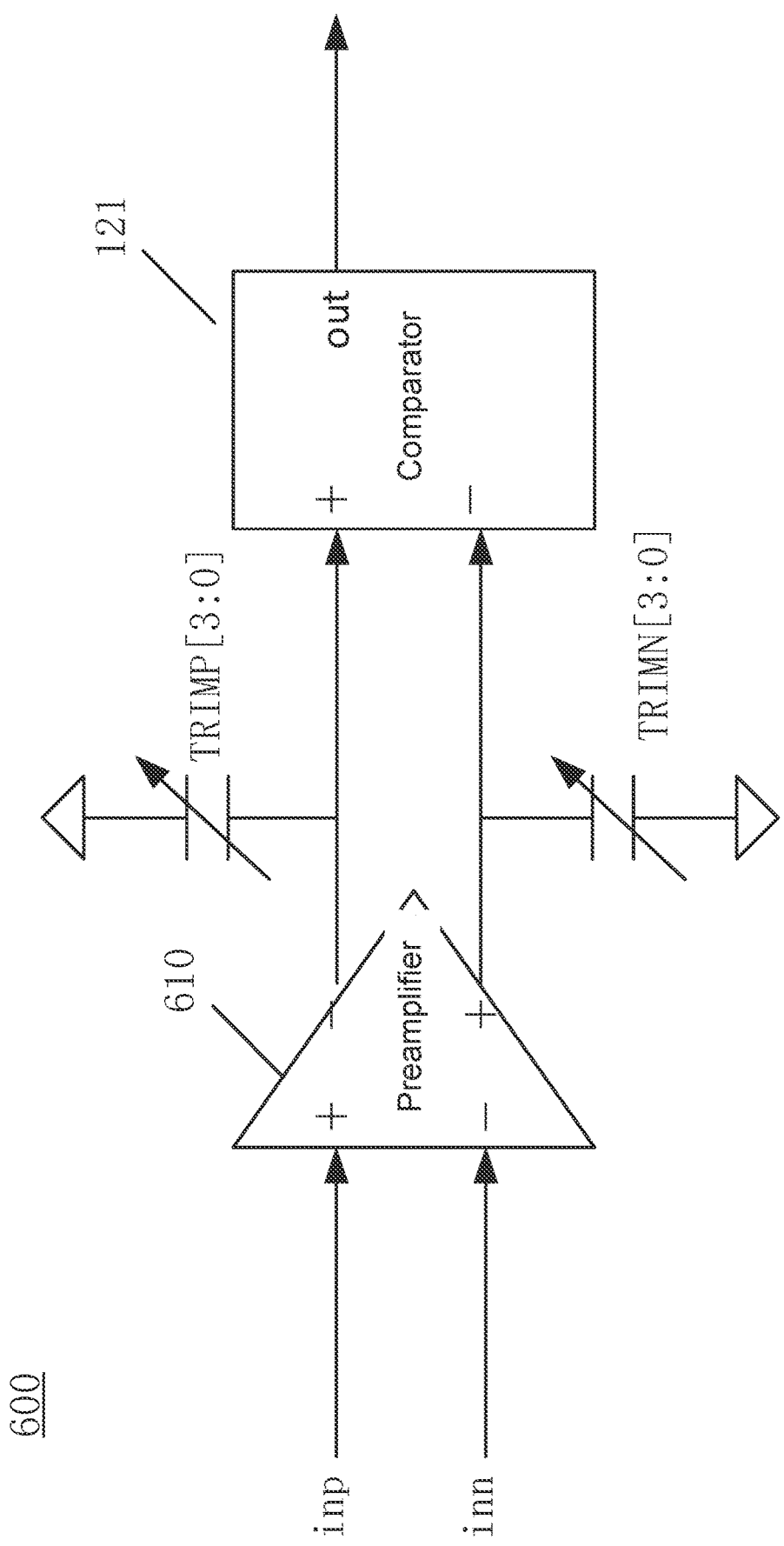
FIG. 6 is a schematic diagram illustrating a circuit structure of a capacitor calibration circuit according to some embodiments of the present disclosure.

FIG. 6 is a schematic diagram illustrating a circuit structure of a capacitor calibration circuit according to some embodiments of the present disclosure. A mismatch between the positive input end (i.e., the first input end described above) and the negative input end (i.e., the second input end described above) of the comparator 121 may result in that a comparison of the comparator 121 is inaccurate, thus affecting a calibration result. In some embodiments, the voltage calibration device 100 may also include a capacitor calibration circuit 600 connected to the comparator 121, and the capacitor calibration circuit 600 may provide a capacitance correction to the comparator 121 to eliminate the mismatch of the comparator 121. In some embodiments, as shown in FIG. 6, the capacitor calibration circuit 600 may include a preamplifier 610, a positive input end inp of the preamplifier 610 receives a target channel voltage and a negative input end inn receives a common mode voltage with a calibration channel; the negative output end of the preamplifier 610 is connected to the positive input end of the comparator 121, the positive output end of the preamplifier 610 is connected to the negative input end of the comparator 121, the output end of the comparator 121 outputs the calibration signal, the negative output end and the positive input end of the preamplifier 610 are connected to the adjustable capacitor TRIMP[3:0] and the adjustable capacitor TRIMN[3:0], respectively.

In some embodiments, the capacitor calibration circuit 600 may provide a certain capacitance correction to the output of the comparator 121 by an adjustable capacitor, thereby eliminating the mismatch of the comparator 121, avoiding an inaccurate comparison result of the comparator 121, and improving the accuracy of the voltage calibration device 100.

In some optional embodiments, instead of the channel selector 110, the voltage calibration device 100 may be provided with an independent calibration unit 120 for each channel to be calibrated, and each calibration unit 120 may include a digital-to-analog converter 1231, a feedback amplifier circuit 1232, a comparator 121, and a result checker 122 to calibrate each channel to be calibrated separately to improve the calibration efficiency.

FIG. 7 is a flowchart illustrating a voltage calibration method according to some embodiments of the present disclosure. In some embodiments, process 700 may be implemented by the voltage calibration device 100.

In some embodiments, the process 700 may include:

Step 710: obtaining common mode voltages of multiple channels to be calibrated.

In some embodiments, the multiple channels to be calibrated may be channels in the imaging system that are connected to the detectors. In some embodiments, the common mode voltages of the multiple channels to be calibrated may be the voltages across the channels to be calibrated with the detector at rest. The specific implementation of the channels to be calibrated and the common mode voltages can be found in the relevant description in FIGS. 2 and 3 above and is not repeated here.

In some embodiments, the step 710 may include: obtaining the common mode voltages of the multiple channels to be calibrated at different moments, respectively. Further, in some embodiments, each channel to be calibrated may be selected from the multiple channels to be calibrated in order, and the common mode voltages of the channels to be calibrated may be obtained at different moments, respectively, for calibration at successive times. Correspondingly, in some embodiments, the common mode voltages of the multiple channels to be calibrated may be sequentially collected and calibrated. In other words, the calibration of one channel to be calibrated may be completed before the calibration of the next channel to be calibrated. For example, the common mode voltage of the $i_{th}$ channel to be calibrated is adjusted first, and after the calibration of the $i_{th}$ channel to be calibrated is completed, the (i+1)st channel to be calibrated is selected and the common mode voltage of the (i+1)st channel to be calibrated is obtained. i, i+1 are positive integers less than the amount of channels.

In some embodiments, the step 710 may include: obtaining the common mode voltages corresponding to multiple channels to be calibrated in parallel, e.g., obtaining the common mode voltages corresponding to different channel to be calibrated by the voltage calibration device at the same time. Accordingly, the voltage calibration device 100 may obtain and calibrate the common mode voltages corresponding to each channel to be calibrated in parallel to improve the calibration efficiency. For example, multiple voltage calibration devices 100 may be provided, and the common mode voltages of the multiple channels to be calibrated may be obtained simultaneously and calibrated by using the calibration unit 120 corresponding to each channel to be calibrated.

Step 720: adjusting the common mode voltages of the multiple channels to be calibrated to calibrated common mode voltages such that the multiple channels to be calibrated are detected under the calibrated common mode voltages.

In some embodiments, the calibrated common mode voltage of a channel to be calibrated is the common mode voltage at the end of the calibration of the channel to be calibrated. In some embodiments, the calibration common mode voltages of the multiple channels to be calibrated are within a preset voltage range. That is, the multiple calibrated common mode voltages are within a specific range such that the multiple calibrated common mode voltages are close to each other, thereby improving the consistency of the channels to be calibrated.

In some embodiments, the common mode voltage of each channel to be calibrated is adjusted to a calibrated common mode voltage so that the calibrated common mode voltages of the multiple channels to be calibrated are close to each other. In this way, by adjusting the common mode voltages of the multiple channels to be calibrated, the consistency of the channels can be improved, and thus the detection performance of the detectors connected to the multiple channels to be calibrated can be enhanced to ensure the imaging quality of the imaging system.

In some embodiments, the step 720 may include: receiving a target channel voltage. Based on a comparison result of the target channel voltage and the common mode voltage, the corresponding channel to be calibrated is adjusted to the calibrated common mode voltage. The difference between the calibrated common mode voltages of the multiple channels to be calibrated and the target channel voltages is less than a preset voltage threshold.

In some embodiments, the target channel voltage may be a reference value for adjusting the common mode voltages of the multiple channels to be calibrated. In some embodiments, the difference between the calibrated common mode voltage and the target channel voltage may characterize the difference between the actual value of the common mode voltage of the channel to be calibrated and the target value after ending the calibration. In some embodiments, the preset voltage threshold may be used to limit the difference between the actual value of the common mode voltage of the channel to be calibrated and the target value. For example, the smaller the preset voltage threshold is, the closer the calibrated common mode voltage is to the target channel voltage. The specific implementation of the target channel voltage and the preset voltage threshold can be found in the relevant description in the calibration unit of FIG. 4 above and is not repeated here.

In some embodiments, adjusting the common mode voltage by comparing the target channel voltage with the common mode voltage can cause the calibrated common mode voltages of the multiple channels to be calibrated to be close to the target channel voltage, thereby improving the consistency of the channels.

In some embodiments, the above-mentioned adjustment of the channel to be calibrated to a calibrated common mode voltage may include: adjusting the common mode voltage to vary a preset stepping voltage based on the comparison result of the target channel voltage and the common mode voltage.

In some embodiments, the comparison result of the target channel voltage and the common mode voltage may determine a variation tendency of the common mode voltage of the channel to be calibrated. For example, in the case where the common mode voltage of the channel to be calibrated is greater than the target channel voltage, the calibration unit may decrease the common mode voltage of the channel to be calibrated. In some embodiments, the preset stepping voltage is a voltage value at which the common mode voltage needs to change during each cycle. The comparison result of the target channel voltage and the common mode voltage, and the specific implementation of the preset stepping voltage, can be found in the relevant description in the calibration unit of FIG. 4 above, and is not repeated here.

In some embodiments, the preset stepping voltage corresponds to a preset voltage threshold. In some embodiments, the preset stepping voltage may be determined based on the preset voltage threshold, and the preset stepping voltage may be used to limit the difference between the calibrated common mode voltage and the target channel voltage.

In some embodiments, for each channel to be calibrated, the common mode voltage may be adjusted by cyclic stepping. In some embodiments, the following cyclic process is performed for the channel to be calibrated, and the cyclic process may include (1) obtaining a comparison result of the target channel voltage and the common mode voltage. (2) adjusting the common mode voltage to vary a preset stepping voltage according to the comparison result until a preset condition is met for the comparison result. In some embodiments, the difference between the calibrated common mode voltage and the target channel voltage may be less than the preset voltage threshold when the preset condition is met. In the case that the preset condition is not met, the calibration unit may use the adjusted common mode voltage as the common mode voltage in the next cycle, and repeat the above cycle flows (1)-(2). In the case that the preset condition is met, i.e., the comparison result changes (or flips), the adjustment of the common mode voltage may be stopped, at which time the common mode voltage of the channel to be calibrated is the calibrated common mode voltage, and the calibrated common mode voltage is close to the target channel voltage, thus improving the overall consistency of the channel.

An exemplary voltage calibration process is provided below to illustrate how the calibration is specifically implemented.

Figure 8:
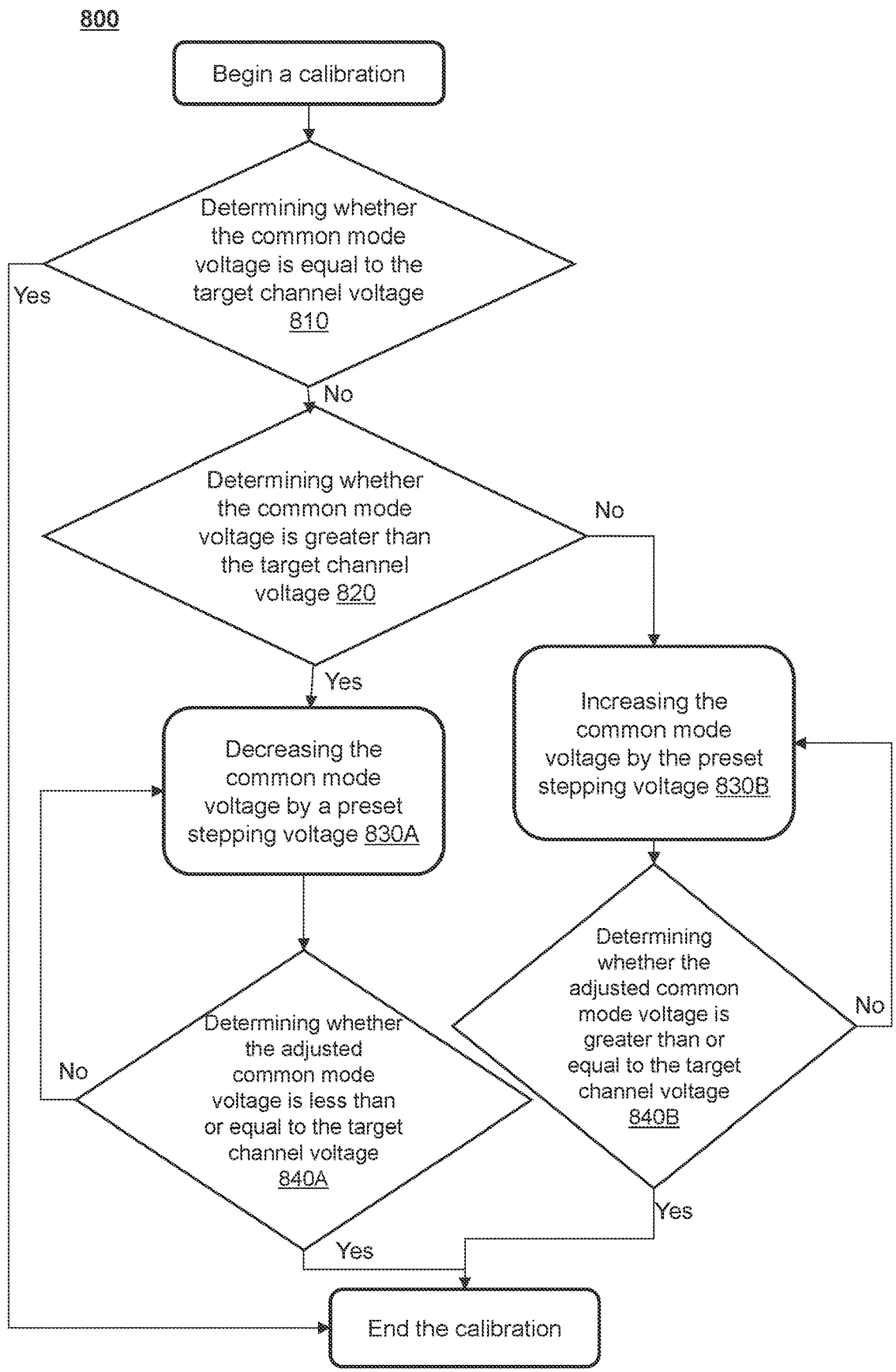
FIG. 8 is a flowchart illustrating a calibration judgment according to some embodiments of the present disclosure.

FIG. 8 is a flowchart illustrating a calibration process according to some embodiments of the present disclosure. In some embodiments, process 800 may be a calibration process for a common mode voltage of a channel to be calibrated. In some embodiments, process 800 may be implemented by the calibration unit 120. In some embodiments, process 800 may be performed after step 710.

In some embodiments, process 800 may include:

Step 810, determining whether the common mode voltage is equal to the target channel voltage. The common mode voltage is an initial common mode voltage of the channel to be calibrated.

In some embodiments, the common mode voltage being equal to the target channel voltage may reflect that the common mode voltage of the channel to be calibrated is close to or equal to the desired common mode voltage. The common mode voltage not being equal to the target channel voltage may reflect that voltage calibration is required.

Further, in some embodiments, if the common mode voltage is equal to the target channel voltage, then the calibration is completed; if the common mode voltage is not equal to the target channel voltage, then step 820 is performed.

Step 820, determining whether the common mode voltage is greater than the target channel voltage.

In some embodiments, the common mode voltage being greater than the target channel voltage may reflect that the common mode voltage of the channel to be calibrated exceeds the desired common mode voltage; and the common mode voltage being less than the target channel voltage may reflect that the common mode voltage of the channel to be calibrated is less than the desired common mode voltage. In some embodiments, if the common mode voltage is greater than the target channel voltage, step 830A is performed to reduce the common mode voltage of the channel to be calibrated; if the common mode voltage is less than the target channel voltage, step 830B is performed to increase the common mode voltage of the channel to be calibrated.

In some embodiments, step 810 and step 820 may be performed by the comparator 121. And, step 810 and step 820 may be performed simultaneously (e.g., by multiple comparators) or may be performed sequentially. Step 810 may be performed before step 820 or after step 820. In some embodiments, the comparator 121 performs a comparison of the common mode voltage with the target channel voltage once to complete the execution of step 810 and step 820. Moreover, step 810 and step 820 may perform the function in the cyclic process (1) above, i.e., obtaining the comparison result of the target channel voltage and the common mode voltage.

Step 830A, decreasing the common mode voltage by a preset stepping voltage.

Step 830B, increasing the common mode voltage by the preset stepping voltage.

In some embodiments, step 830A and step 830B may be performed by the calibration unit 123 to adjust the common mode voltage of that channel to be calibrated. Moreover, step 830A and step 830B may perform the function in the above cyclic process (2), i.e., adjusting the common mode voltage to vary the preset stepping voltage based on the comparison result. In some embodiments, if the preset condition is not met, it is necessary to perform step 820-step 830B cyclically, and if it is met, the calibration is stopped.

Step 840A, determining whether the common mode voltage is less than or equal to the target channel voltage. Relative to step 820, when a judgment result of step 840A is that the common mode voltage is less than or equal to the target channel voltage, it may reflect that the comparison result has changed, and calibration may be stopped.

Step 840B, determining whether the common mode voltage is greater than or equal to the target channel voltage. Similarly, with respect to step 820, when the judgment result of step 840B is that the common mode voltage is greater than or equal to the target channel voltage, it can reflect that the comparison result has changed, and the calibration can be stopped.

In some embodiments, steps 840A and 840B may continue to be performed by the comparator 121. Correspondingly, the result checker 122 may determine whether the calibration needs to be ended by checking whether the comparison result changes as described above.

In some embodiments, the preset stepping voltage includes a first stepping voltage and a second stepping voltage. Correspondingly, the above-mentioned adjustment of the common mode voltage to vary the preset stepping voltage based on each comparison result of the target channel voltage and the common mode voltage until the adjustment stops after the comparison result changes may include: selecting the first stepping voltage or the second stepping voltage to adjust the common mode voltage based on each comparison result of the difference between the target channel voltage and the common mode voltage and a preset voltage difference range, so that the adjusted common mode approaches the target channel voltage, until the flip of the difference between the target channel voltage and the adjusted common mode voltage.

In some embodiments, the first stepping voltage and the second stepping voltage may be preset stepping voltages with different voltage values. In some embodiments, the flip of the difference between the target channel voltage and the common mode voltage may indicate that the difference between the calibrated common mode voltage and the target channel voltage is less than a preset voltage threshold. The specific implementation of the first stepping voltage and the second stepping voltage can be found in the relevant descriptions above and is not repeated here.

In some embodiments, the first stepping voltage or the second stepping voltage is selected to adjust the common mode voltage based on the comparison result of the difference between the target channel voltage and the common mode voltage and the preset voltage difference range. For example, when the difference is outside the preset voltage difference range, indicating that the difference between the target channel voltage and the common mode voltage is large, the first stepping voltage is selected for adjusting the common mode voltage to quickly reduce the difference between the common mode voltage and the target channel voltage and improve the regulation efficiency. When the difference is within the preset voltage difference range, it can indicate that the difference between the target channel voltage and the common mode voltage is small, then the second stepping voltage is selected to adjust the common mode voltage to improve the adjustment accuracy of the common mode voltage.

In some embodiments, after step 720 above, process 700 may further include: storing the calibrated common mode voltages. In some embodiments, the common mode voltage of each channel to be calibrated may be stored in transitory manner. In some embodiments, in the event that the voltage of a channel to be calibrated ends the calibration and the channel is needed for operation normally, the stored calibrated common mode voltage corresponding to the channel to be calibrated may be obtained and the common mode voltage of the channel to be calibrated may be adjusted according to the calibrated common mode voltage, thereby eliminating the need to adjust the voltage again by cyclic stepping and improving the calibration efficiency of the channel. In some embodiments, the calibrated common mode voltage may be stored in non-transitory manner. The calibrated common mode voltage can be read out from the storage quickly and without the need to calibrate again.

It should be noted that the above description of process 700 and 800 is intended to be exemplary and illustrative only, and does not limit the scope of application of the present disclosure. For a person skilled in the art, various amendments and changes can be made to the process 700 under the guidance of the present disclosure. However, these amendments and changes remain within the scope of the present disclosure. For example, in the step of selecting the first stepping voltage and the second stepping voltage described above, a larger number of stepping voltages can also be set. Correspondingly, it is also possible to select the corresponding stepping voltage for adjustment based on the voltage difference range where each difference between the target channel voltage and the common mode voltage is located, thereby improving the efficiency of voltage adjustment.

The basic concepts have been described above, apparently, in detail, as will be described above, and does not constitute limitations of the disclosure. Although there is no clear explanation here, those skilled in the art may make various modifications, improvements, and modifications of present disclosure. This type of modification, improvement, and corrections are recommended in present disclosure, so the modification, improvement, and the amendment remains in the spirit and scope of the exemplary embodiment of the present disclosure.

At the same time, present disclosure uses specific words to describe the embodiments of the present disclosure. As "one embodiment", "an embodiment", and/or "some embodiments" means a certain feature, structure, or characteristic of at least one embodiment of the present disclosure. Therefore, it is emphasized and should be appreciated that two or more references to "an embodiment" or "one embodiment" or "an alternative embodiment" in various parts of present disclosure are not necessarily all referring to the same embodiment. Further, certain features, structures, or features of one or more embodiments of the present disclosure may be combined.

Moreover, unless the claims are clearly stated, the sequence of the present disclosure, the use of the digital letters, or the use of other names is not configured to define the order of the present disclosure processes and methods. Although some examples of the disclosure currently considered useful in the present disclosure are discussed in the above disclosure, it should be understood that the details will only be described, and the appended claims are not limited to the disclosure embodiments. The requirements are designed to cover all modifications and equivalents combined with the substance and range of the present disclosure. For example, although the implementation of various components described above may be embodied in a hardware device, it may also be implemented as a software only scheme, e.g., an installation on an existing server or mobile device.

Similarly, it should be noted that in order to simplify the expression disclosed in the present disclosure and help the understanding of one or more invention embodiments, in the previous description of the embodiments of the present disclosure, a variety of features are sometimes combined into one embodiment, drawings or description thereof. However, this disclosure method does not mean that the characteristics required by the object of the present disclosure are more than the characteristics mentioned in the claims. Rather, claimed subject matter may lie in less than all features of a single foregoing disclosed embodiment.

In some embodiments, numbers expressing quantities of ingredients, properties, and so forth, configured to describe and claim certain embodiments of the application are to be understood as being modified in some instances by the term "about," "approximate," or "substantially". Unless otherwise stated, "approximately", "approximately" or "substantially" indicates that the number is allowed to vary by ±20%. Accordingly, in some embodiments, the numerical parameters used in the specification and claims are approximate values, and the approximate values may be changed according to characteristics required by individual embodiments. In some embodiments, the numerical parameters should be construed in light of the number of reported significant digits and by applying ordinary rounding techniques. Although the numerical domains and parameters used in the present disclosure are configured to confirm its range breadth, in the specific embodiment, the settings of such values are as accurately as possible within the feasible range.

For each patent, patent application, patent application publication and other materials referenced by the present disclosure, such as articles, books, instructions, publications, documentation, etc., hereby incorporated herein by reference. Except for the application history documents that are inconsistent with or conflict with the contents of the present disclosure, and the documents that limit the widest range of claims in the present disclosure (currently or later attached to the present disclosure). It should be noted that if a description, definition, and/or terms in the subsequent material of the present disclosure are inconsistent or conflicted with the content described in the present disclosure, the use of description, definition, and/or terms in this manual shall prevail.

Finally, it should be understood that the embodiments described herein are only configured to illustrate the principles of the embodiments of the present disclosure. Other deformations may also belong to the scope of the present disclosure. Thus, as an example, not limited, the alternative configuration of the present disclosure embodiment may be consistent with the teachings of the present disclosure. Accordingly, the embodiments of the present disclosure are not limited to the embodiments of the present disclosure clearly described and described.

What is claimed is:

1. A voltage calibration device, comprising: a channel selector and a calibration unit, wherein
   an input end of the channel selector is selectively connected to channels to be calibrated of multiple detectors to receive a common mode voltage of each channel to be calibrated;
   a first input end of the calibration unit is connected to an output end of the channel selector, an output end of the calibration unit is connected to the multiple channels to be calibrated, the calibration unit adjusting the common mode voltage of each channel to be calibrated to a calibrated common mode voltage to cause each channel to be calibrated to be detected under its corresponding calibrated common mode voltage,
   wherein the calibrated common mode voltages of the multiple channels to be calibrated are within a preset voltage range.

2. The voltage calibration device of claim 1, wherein a second input end of the calibration unit receives a target channel voltage, and the calibration unit adjusts the common mode voltage of each channel to be calibrated to the calibrated common mode voltage based on a comparison result of the target channel voltage and the common mode voltage;
   wherein a difference between the calibrated common mode voltages of the multiple channels to be calibrated and the target channel voltage is less than a preset voltage threshold.

3. The voltage calibration device of claim 2, wherein to adjust the common mode voltage of each channel to be calibrated to the calibrated common mode voltage based on a comparison result of the target channel voltage and the common mode voltage, the calibration unit is configured to:
   adjusting, by the calibration unit, the common mode voltage to vary a preset stepping voltage based on the comparison result of the target channel voltage and the common mode voltage.

4. The voltage calibration device of claim 3, wherein the calibration unit is configured to:

adjust the common mode voltage incrementally to increase by the preset stepping voltage when the common mode voltage is less than the target channel voltage; and adjust the common mode voltage incrementally to decrease by the preset stepping voltage when the common mode voltage is greater than the target channel voltage.

5. The voltage calibration device of claim 4, wherein the calibration unit is further configured to:

adjust the common mode voltage to vary the preset stepping voltage according to each comparison result of the target channel voltage and the common mode voltage until the calibrated common mode voltage is output after the comparison result is changed, wherein, in each comparison, a current common mode voltage is equal to a last common mode voltage in last comparison varying the preset stepping voltage.

6. The voltage calibration device of claim 4, wherein the calibration unit includes a comparator and a result checker;

a first input end of the comparator receives the common mode voltage of each channel to be calibrated, a second input end of the comparator receives the target channel voltage, and an output end of the comparator outputs a calibration signal to adjust the common mode voltage to vary the preset stepping voltage, the calibration signal being determined according to the comparison result of the common mode voltage with the target channel voltage; and an input end of the result checker is connected to the output end of the comparator, the result checker is configured to send an end-of-calibration signal to the channel selector corresponding to each channel to be calibrated.

7. The voltage calibration device of claim 6, wherein the result checker is configured to:

send the end-of-calibration signal, if the common mode voltage is greater than or equal to the target channel voltage in a current comparison, and a last comparison result is that the common mode voltage is less than the target channel voltage; or if the common mode voltage is less than or equal to the target channel voltage in the current comparison, and the last comparison result is that the common mode voltage is greater than the target channel voltage, wherein in each comparison, the current common mode voltage is equal to the last common mode voltage in last comparison varying the preset stepping voltage.

8. The voltage calibration device of claim 6, wherein the calibration unit further includes at least one voltage controller, wherein an input end of the at least one voltage controller is connected to the output end of the comparator, and an output end of the at least one voltage controller is connected to a corresponding channel to be calibrated, wherein the at least one voltage controller adjusts the common mode voltage according to the comparison result so that the first input end of the comparator receives the adjusted common mode voltage.

9. The voltage calibration device of claim 8, wherein the at least one voltage controller includes a digital-to-analog converter and a feedback amplifier circuit;

an input end of the digital-to-analog converter is connected at least to the output end of the comparator, the input end of the digital-to-analog converter receives the calibration signal and adjusts an output analog signal according to the calibration signal;

an input end of the feedback amplifier circuit is connected at least to the output end of the digital-to-analog converter, an output end of the feedback amplifier circuit is connected to the corresponding channel to be calibrated, the feedback amplifier circuit adjusting the common mode voltage of the corresponding channel to be calibrated according to the analog voltage signal.

10. The voltage calibration device of claim 9, wherein the digital-to-analog converter outputs an analog voltage signal, the feedback amplifier circuit includes a main amplifier and a first auxiliary amplifier; wherein a positive input end of the main amplifier is connected to the output end of the digital-to-analog converter, a negative input end of the main amplifier is connected to an output end of the first auxiliary amplifier, an output end of the main amplifier is connected to an input end of the first auxiliary amplifier, and the output end of the first auxiliary amplifier is further connected to the corresponding channel to be calibrated to adjust a common mode voltage of the channel to be calibrated according to the analog voltage signal.

11. The voltage calibration device of claim 9, wherein the digital-to-analog converter outputs an analog current signal, the feedback amplifier circuit includes a summator, a transconductance amplifier and a second auxiliary amplifier; wherein a first input end of the summator is connected to the output end of the digital-to-analog converter, a second input end of the summator is connected to an output end of the transconductance amplifier, and an output end of the summator is connected to an input end of the second auxiliary amplifier, the summator being configured to sum a current of the channel to be calibrated and the analog current signal;

a negative input end of the transconductance amplifier is connected to an output end of the second auxiliary amplifier, the output end of the second auxiliary amplifier being further connected to the corresponding channel to be calibrated to adjust a common mode voltage of the channel to be calibrated according to the analog current signal.

12. The voltage calibration device of claim 6, wherein the voltage calibration device further includes a capacitor calibration circuit connected to the comparator, the capacitor calibration circuit providing a capacitance correction for the comparator.

13. The voltage calibration device of claim 3, wherein the preset stepping voltage includes a first stepping voltage and a second stepping voltage, wherein the first stepping voltage and the second stepping voltage are different; and the calibration unit is further configured to: select the first stepping voltage or the second stepping voltage to adjust the common mode voltage according to a comparison result of a difference of the target channel voltage and the common mode voltage with a preset voltage difference range.

14. The voltage calibration device of claim 3, wherein the preset stepping voltage is related to the preset voltage threshold.

15. The voltage calibration device of claim 1, wherein the channel selector is further configured to store the calibrated common mode voltage corresponding to each channel to be calibrated.

16. An imaging system comprises: a processing unit, multiple detectors, multiple channels to be calibrated and a voltage calibration device, wherein the processing unit is connected to the multiple detectors through the multiple channels to be calibrated, the voltage calibration device is selectively connected to the multiple channels to be calibrated, and the voltage calibration device is configured to adjust common mode voltages of the multiple channels to be calibrated.

* * * * *